United States Patent
Miyatake et al.

(10) Patent No.: US 6,992,343 B2
(45) Date of Patent: Jan. 31, 2006

(54) SEMICONDUCTOR MEMORY DEVICE

(75) Inventors: Shinichi Miyatake, Ome (JP);
Kazuhiko Kajigaya, Iruma (JP);
Kazuyuki Miyazawa, Hidaka (JP);
Tomonori Sekiguchi, Tama (JP);
Riichiro Takemura, Tokyo (JP);
Takeshi Sakata, Hino (JP)

(73) Assignees: Hitachi, Ltd., Tokyo (JP); Hitachi ULSI Systems Co., Ltd., Tokyo (JP); Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/975,494

(22) Filed: Oct. 29, 2004

(65) Prior Publication Data
US 2005/0056876 A1   Mar. 17, 2005

Related U.S. Application Data

(62) Division of application No. 10/388,639, filed on Mar. 17, 2003, now Pat. No. 6,828,612.

(30) Foreign Application Priority Data

Mar. 15, 2002 (JP) .............................. 2002-071254

(51) Int. Cl.
*H01L 27/108* (2006.01)
*H01L 29/76* (2006.01)
*H01L 29/94* (2006.01)
*H01L 31/119* (2006.01)

(52) U.S. Cl. ...................... 257/296; 257/311; 257/905; 257/906

(58) Field of Classification Search ................ 257/296, 257/311, 905, 906
See application file for complete search history.

(56) References Cited

U.S. PATENT DOCUMENTS

| 1,502,334 A | | 7/1924 | Cain |
| 6,620,680 B2 | * | 9/2003 | Doan et al. ................. 438/253 |
| 6,867,994 B2 | * | 3/2005 | Tsukikawa .................... 365/72 |

(Continued)

FOREIGN PATENT DOCUMENTS

| JP | 54-28252 | | 9/1979 |
| JP | 55157194 | A | 12/1980 |
| JP | 61034790 | A | 2/1986 |
| JP | 07130172 | A | 5/1995 |
| JP | 08222706 | A | 8/1996 |
| JP | 2001-143463 | A | 5/2001 |

*Primary Examiner*—Ngân V. Ngô
(74) *Attorney, Agent, or Firm*—Antonelli, Terry, Stout and Kraus, LLP.

(57) ABSTRACT

A semiconductor memory device is provided which can achieve the high integration, ultra-high speed operation, and significant reduction of power consumption during the information holding time, by reducing the increase in the area of a memory cell and obtaining a period of the ultra-high speed readout time and ensuring a long refresh period at the time of the self refresh. A DRAM employing a one-intersection cell·two cells/bit method has a twin cell structure employing a one-intersection $6F^2$ cell, the structure in which: memory cells are arranged at positions corresponding to all of the intersections between a bit-line pair and a word line; and when a half pitch of the word line is defined as F, a pitch of each bit line of the bit-line pair is larger than 2F and smaller than 4F. Further, an active region in the silicon substrate, on which a source, channel and drain of the transistor of each memory cell are formed, is obliquely formed relative to the direction of the bit-line pair.

18 Claims, 23 Drawing Sheets

U.S. PATENT DOCUMENTS

2001/0033510 A1 * 10/2001 Allen et al. .................. 365/145
2002/0003728 A1    1/2002 Honioschmid et al.
2002/0051378 A1 *  5/2002 Ohsawa ...................... 365/149
2002/0172067 A1 * 11/2002 Kirihata et al. ................ 365/69
2003/0039158 A1    2/2003 Horiouchi et al.
2004/0043546 A1 *  3/2004 Yoshida et al. ............. 438/149
2005/0064656 A1 *  3/2005 Tran ........................... 438/232

* cited by examiner

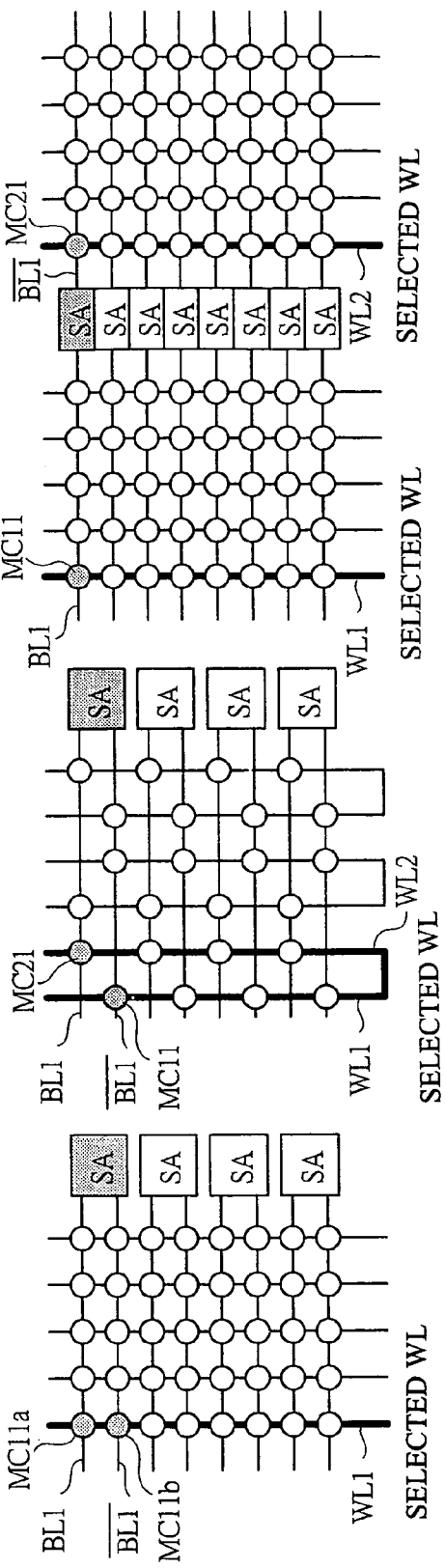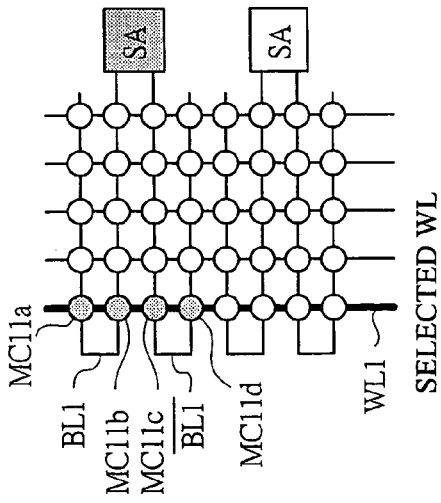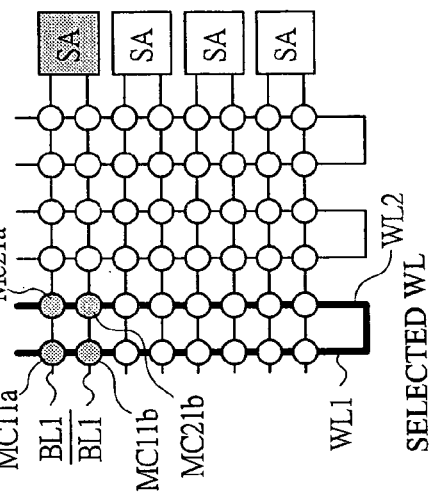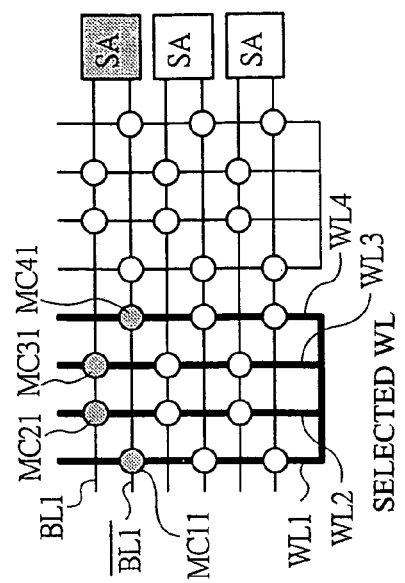

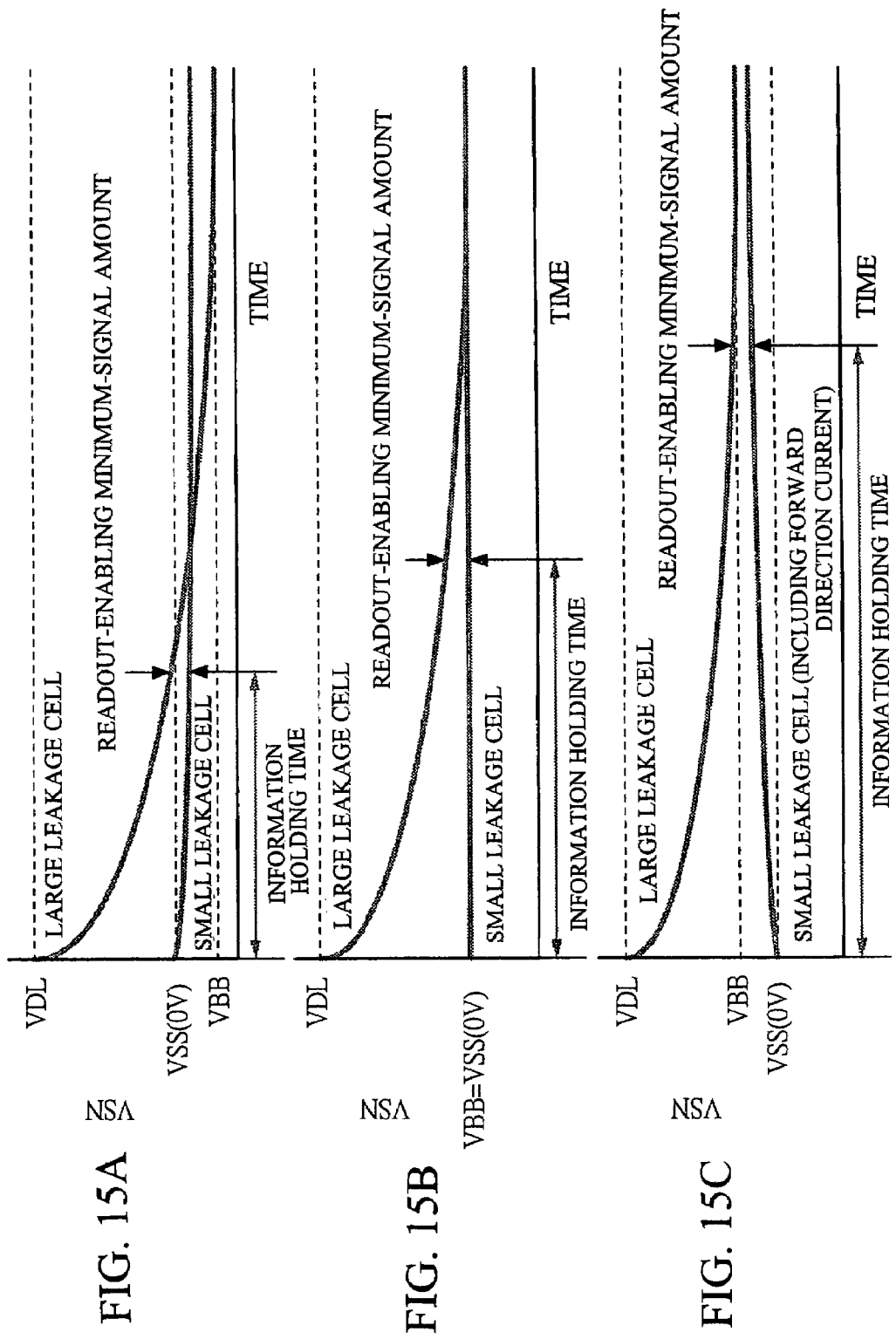

SEMICONDUCTOR MEMORY DEVICE

CROSS-REFERENCE TO RELATED APPLICATIONS

This is a Divisional of application Ser. No. 10/388,639, filed Mar. 17, 2003 now U.S. Pat. No. 6,828,612, the entire disclosure of which is hereby incorporated by reference.

BACKGROUND OF THE INVENTION

The present invention relates to s semiconductor memory device, and more particularly to a technique effectively applied to a semiconductor memory device such as a DRAM etc. adopting a connection method, which is called a two cells/bit method employing a so-called one-intersection cell.

According to examinations by the inventors of the present invention, the following techniques are available for the DRAM as an example of the semiconductor memory device.

For example, with respect to the DRAM, there are an open bit-line method and a folded bit-line method as methods of connecting a sense amplifier and a bit-line pair. The former open bit-line method is one in which two bit lines to be connected to one sense amplifier are separately connected on both sides to put the sense amplifier therebetween. By the open bit-line method, a so-called one-intersection memory cell structure is formed in which memory cells MC are connected to all of the intersections between the bit-line pair BL and /BL and a word line WL. The theoretical minimum cell area of the one-intersection memory cell is $4F^2$ ($2F \times 2F$) in terms of a memory-cell-area representing method employing the value "F" of half the pitch of the word line. As a typical example of the one-intersection memory cell, the one having an area of about $6F^2$ ($2F \times 3F$) has been reported in the academic conference. The latter folded bit-line method is one in which two bit lines to be connected to one sense amplifier are folded and connected in the same direction relative to the sense amplifier. In the folded bit-line method, a so-called two-intersection memory cell structure is formed in which the memory cells MC are connected to half of the intersections between the bit-line pair BL and /BL and the word line WL. The theoretical minimum cell area of the two-intersection memory cell is $8F^2$ ($4F \times 2F$) in terms of the memory-cell-area representing method employing the value "F" of half the pitch of the word line.

The former open bit-line method has a high risk of obtaining error information from the memory cell since the fluctuation in a word line potential is applied to only one of the bit-line pair due to parasitic capacitance applied between the word line and the bit line. In contrast to this, the latter folded bit-line method can cancel the noise between the bit lines since the fluctuation in a word line potential (noise) is equally applied to both of the bit-line pair via the parasitic capacitance applied between the word line and the bit line. Consequently, the folded bit-line method is one suitable for the DRAM that detects and amplifies the voltage of small signal from the memory cell and, for example, is more frequently used in the DRAM of 64 kbit or lager.

Meanwhile, in DRAM employing the connection method called a two cells/bit method, there is a connection method generally called a two-intersection cell·two cells/bit method among the connection methods of the memory cells arranged at the intersections between the word lines and the bit lines. This two-intersection cell·two cells/bit method has a structure in which: a first memory cell is connected to the intersection between one of the bit-line pair and a first word line; a second memory cell is connected to the intersection between the other of the bit-line pair and a second word line; and the two memory cells correspond to one bit.

Additionally, a memory cell of the one-intersection cell·two cells/bit method is also proposed similarly. This one-intersection cell·two cells/bit method has a structure in which: a first memory cell is connected to the intersection between one of the bit-line pair and a word line; a second memory cell is connected to the intersection between the other of the bit-line pair and the same word line; and the two memory cells correspond to one bit.

Note that as techniques concerning the above-mentioned DRAM employing the one-intersection cell·two cells/bit method, there are recited, for example, Japanese Patent Laid-Open Nos. 61-34790, 55-157194, 8-222706 (U.S. Pat. No. 5,661,678 corresponding thereto), and 2001-143463 (U.S. Pat. No. 6,344,990 corresponding thereto) and Japanese Patent Publication No. 54-28252 (GB patent No. 1,502,334 corresponding thereto), etc. Also, as a technique concerning the DRAM of the two-intersection cell·two cells/bit method, Japanese Patent Laid-Open No. 7-130172 is disclosed.

SUMMARY OF THE INVENTION

Meanwhile, as a result of examination by the inventors about the techniques for the DRAM as described above, the followings have been found.

For example, in a one cell/bit method, since the signal amount on a "H" side is decreased depending on a refresh period, a bit-line signal amount before the amplification of the bit line cannot be used in a high-speed reading method that is read out by a direct sense method. Also, since the one-intersection cell method of the one cell/bit must employ the open bit-line method, array noises become a problem, whereby a reduction in the signal amount is an object to be solved.

As a premise of the present invention examined by the inventors, the two cells/bit method employing the above-mentioned $8F^2$ ($4F \times 2F$) will be described with reference to FIGS. 22 and 23. FIG. 22 is a connection diagram showing the state of the connections between the bit-line pairs orthogonal to the word lines and the sense amplifiers. FIGS. 23A and 23B are a schematic plan view and a schematic sectional view which show a twin cell structure of the memory cell, respectively.

In the two cells/bit method employing the $8F^2$ ($4F \times 2F$), the connections between the bit-line pairs orthogonal to the word lines and the sense amplifiers are shown in FIG. 22, wherein bit lines BL and /BL are not adjacent to each other and alternately arranged and these two lines are connected to a sense amplifier SA as a bit-line pair BL and /BL. There are a plurality of bit-line pairs BL and /BL connected in this manner, and the sense amplifiers SA are alternately connected to and arranged on the right and left ends of each bit-line pair. Further, each memory cell MC is arranged at positions corresponding to half the ones of the intersections between the bit-line pair BL and /BL and the word line WL.

The two cells/bit method employing the $8F^2$ ($4F \times 2F$) is, as shown in FIG. 23A, constituted to include: a plurality of folded-type bit-line pairs BL and /BL arranged in parallel to each other; a plurality of word lines WL orthogonal to the plurality of bit-line pairs BL and /BL; memory cells MC arranged at position corresponding to half the ones of the intersections between the respective bit-line pairs BL and /BL and the respective word lines WL; and the like. Also, active regions AA on the silicon substrate, in which the source, channel and drain of the transistor of the memory cell MC are formed, are formed in parallel to the bit-line pairs BL and /BL. Note that a portion corresponding to one cell of the memory cell MC is shown by the dash lines.

Further, in the sectional structure thereof, as shown in FIG. 23B, the transistor of the memory cell MC is formed on the active region AA in a P well PWEL of the silicon substrate, wherein: a gate electrode is connected to the word line WL; a source electrode is connected via a storage node contact SCT to a storage node SN to be the other of the electrode of the capacitor; and a drain electrode is connected to the bit-line pair BL and /BL via a bit contact BCT. The storage node SN is arranged at the above and opposite point thereof, and constitutes a capacitor between other plurality of capacitors and a plate PL to be one of the electrode common thereto.

Particularly, in the structure of the two cells/bit method employing the $8F^2$ (4F×2F), when the half pitch of the word line WL is defined as F, the pitch of the bit-line pair BL and /BL is 2F and that of the word line WL is 2F. Since one memory cell is formed with the pitch equivalent to that of the two word lines WL, the area of one cell of the memory cell is $8F^2$ and that of two cells/bit is $16F^2$. Accordingly, it becomes a problem to reduce the increase of the area of the memory cell per one bit in face of the recent advancement of higher integration.

Consequently, an object of the present invention is to provide a semiconductor memory device such as DRAM etc., which can realize high integration and ultra-high speed operation and largely reduce power consumption during a information maintaining period, by suppressing an increase in the area of a memory cell, obtaining ultra-high speed reading, and further achieving a long refresh period at the time of a self refresh.

The above and other objects and novel characteristics of the present invention will be apparent from the description of this specification and the accompanying drawings.

The typical ones of the inventions disclosed in this application will be briefly described as follows.

More specifically, a semiconductor memory device according to the present invention comprises: a plurality of folded-type bit-line pairs arranged in parallel to each other; a plurality of word lines orthogonal to these; and dynamic memory cells each composed of one transistor and one capacitor and arranged in matrix at positions corresponding to the intersections between the plurality of bit-line pairs and the plurality of word lines, wherein one electrode of the capacitor is connected to a common electrode together with those of other plurality of capacitors arranged in matrix, the other electrode thereof is connected to a source electrode of the transistor, a drain electrode of the transistor is connected to the bit-line pair, and a gate electrode thereof is connected to the word line, and wherein, in a structure in which there is connected a circuit for performing the writing of memory information to the memory cell, or the reading of memory information from the memory cell, or the refresh of the memory information of the memory cell in response to the plurality of bit-line pairs, a pitch of each bit line of the bit-line pair is larger than 2F and smaller than 4F when a half pitch of the word line is defined as F. Alternatively, the semiconductor memory device is one which includes a plurality of word lines not orthogonal to the plurality of bit-line pairs.

Also, a semiconductor memory device according to the present invention comprises: a plurality of dynamic memory cells which is composed of one transistor and one capacitor and is to be simultaneously selected; a bit-line pair to which the plurality of selected memory cells are connected; a sense amplifier for amplifying the potential of the bit-line pair to a predetermined "H" and "L" levels; and a pair of MOSFETs in which each of the bit-line pairs is inputted to gates thereof and drains thereof are connected to the data-line pair. In this structure, the plurality of memory cells are simultaneously selected, and signals are read out from the plurality of memory cells to the bit-line pair corresponding to the plurality of memory cells, and the signals read out to the bit-line pair are transmitted to the data line before the amplification by the sense amplifier connected to the bit-line pair.

Also, the semiconductor memory device according to the present invention is one in which: a plurality of dynamic memory cells each composed of one transistor and one capacitor are simultaneously selected; complementary signals are read out to the bit-line pair corresponding to the memory cells; and the potential of the bit-line pair is amplified to the predetermined "H" and "L" levels by the sense amplifier connected to the bit-line pair, wherein the potential of the substrate, on which the back-gate of the transistor is formed, is equal to either of the predetermined "H" or "L" level. Alternatively, the potential of the substrate, on which the back-gate of the transistor is formed, is set to be lower than the voltage of the predetermined "H" level or higher than that of the predetermined "L" level. Alternatively, the semiconductor memory device according to the present invention is one obtained by combining them, that is, one in which the precharge potential of the bit-line pair is made equal to a predetermined "L" or "H" level which is reverse to the potential of the substrate, or equal to a predetermined "L" or "H" level on the side having larger one of the potential difference between the potential of the substrate and its precharge potential.

More specifically, the semiconductor memory device according to the present invention realizes the method of the high-speed reading by using, as a two cells/bit method, the one-intersection cell which is advantageous to high integration. Note that the two-intersection cell too can be used as the two cells/bit method. However, it is not suitable for the high integration, and further the waste occurs such that two of the word lines must be simultaneously selected.

Also, in the present invention, the two memory cells of the DRAM are used as one bit and operated by the folded bit-line method in spite of the one-intersection cell. This can reduce the array noise, whereby it becomes sufficient to start up just one word line to be selected.

Furthermore, the "L" data are certainly stored in either of the two memory cells. The "H"/"L" signal is complementarily outputted to the bit-line pair at the time of the readout. However, in the case where the "H" signal is considered to be the reference of the "L" signal, if the "L" signal amount is ensured, its signal can be read out. This "L" data is transmitted to the main amplifier before the operation of the sense amplifier by the direct sense method, and then sensed. It is unnecessary to completely write the power voltage also in the "H" writing voltage. If the "L" data are complete, it can be easily read out. This allows for the large improvement of the refresh characteristic, the improvement in the soft error resistance, and the low-voltage high-speed operation.

Also, the occupancy of the memory cell is ½ due to the two cells/bit method. However, in the case of the one-intersection cell, the memory cell of about $12F^2$ (twice of $6F^2$) is obtained in a typical example. Therefore, the increase of the cell area can be suppressed to about 1.5 times as small as that of the two cells/bit method using the $8F^2$ cell with the same F value. Furthermore, in the ultra-high speed DRAM, the number of array divisions is increased and the occupancy of the cell becomes about 30%. Therefore, the increase of the cell area can be reduced to about 15%.

Further, if this method is applied to the two cells/bit method employing a VDL precharge method which is effective to the low-voltage operation (e.g., bit line amplitude of 1.2 V or lower), the dummy cell for the reference becomes unnecessary, thereby using the "L" signal amount by 100%. Also, the voltage-increasing power source (VPP) becomes unnecessary for the control of the precharge circuit, and the high-speed bit-line amplification operation can be performed even if a sense-amplifier overdrive method is not used.

As described above, according to the semiconductor memory device of the present invention, (i) even if the "H" data is reduced by the refresh, the "L" data is left. Therefore, it is also possible to operate the main amplifier by the direct sense of the "L" signal. (ii) The readout of the "L" data is more rapid than that of the "H" data, thereby allowing for the high-speed and stable operation. (iii) Since the full writing of the "H" data is unnecessary, the word-line-voltage increasing level can be reduced. (iv) The current consumption in the VPP voltage-increasing circuit can be reduced and the noise generated at the time of operating the VPP generator circuit can be reduced. (v) The bit-line pair has a completely symmetric structure owing to the operation of the folded bit-line method and the noise in the array including the non-selected word-line noise can be completely canceled even in the case of the one-intersection memory cell. (vi) It is possible to largely improve the period of the refresh time and the soft error resistance by the readout of the "L" data.

As a result, the "L" data are certainly stored in either of the cells in the two cells/bit method. Accordingly, data on the side of the "L" has the readout speed higher than the "H" data, thereby allowing for ensuring the signal amount more stably. Additionally, in the operation of the folded bit-line method, the bit lines are arranged on the same array side, thereby allowing for canceling the substrate noises and the plate noises. Furthermore, since the wrap-around noises form the non-selected word line is also caused on the bit-line pair, the loss of the signal amount is prevented. Due to the advantages as described above, it is possible to obtain the stable bit-line signal on the "L" side. If it is directly read out, the data can be transmitted to the output buffer before the driving of the bit line.

BRIEF DESCRIPTIONS OF THE DRAWINGS

FIG. 7A is a connection diagram showing a simultaneous selection method of a plurality of memory cells in a semiconductor memory device according to an embodiment of the present invention.

FIG. 7B is a connection diagram showing another simultaneous selection method of a plurality of memory cells in a semiconductor memory device according to an embodiment of the present invention.

FIG. 7C is a connection diagram showing another simultaneous selection method of a plurality of memory cells in a semiconductor memory device according to an embodiment of the present invention.

FIG. 7D is a connection diagram showing another simultaneous selection method of a plurality of memory cells in a semiconductor memory device according to an embodiment of the present invention.

FIG. 7E is a connection diagram showing another simultaneous selection method of a plurality of memory cells in a semiconductor memory device according to an embodiment of the present invention.

FIG. 7F is a connection diagram showing another simultaneous selection method of a plurality of memory cells in a semiconductor memory device according to an embodiment of the present invention.

FIG. 15A is a waveform diagram showing a potential relationship upon holding memory cell data charges in a semiconductor memory device according to an embodiment of the present invention.

FIG. 15B is a waveform diagram showing a potential relationship upon holding memory cell data charges in a semiconductor memory device according to an embodiment of the present invention.

FIG. 15C is a waveform diagram showing a potential relationship upon holding memory cell data charges in a semiconductor memory device according to an embodiment of the present invention.

DESCRIPTIONS OF THE PREFERRED EMBODIMENTS

Hereinafter, an embodiment of the present invention will be described in detail with reference to the accompanying drawings. Note that components having the same functions are denoted by the same reference symbols throughout the drawings for describing the embodiment and the repetitive description thereof will be omitted.

The semiconductor memory device according to an embodiment of the present invention is applied to, for example, a DRAM employing a one-intersection·two cells/bit method, and, though not particularly limited, is formed on one semiconductor substrate like single crystal silicon by a known semiconductor manufacturing technique. Particularly, the DRAM according to the embodiment is characterized by: 1. a twin cell structure employing a one-intersection $6F^2$ cell; 2. a direct sense+twin cell method; and 3. a substrate potential VSS+twin cell method, etc. and they will be sequentially described below.

Figure 1A:
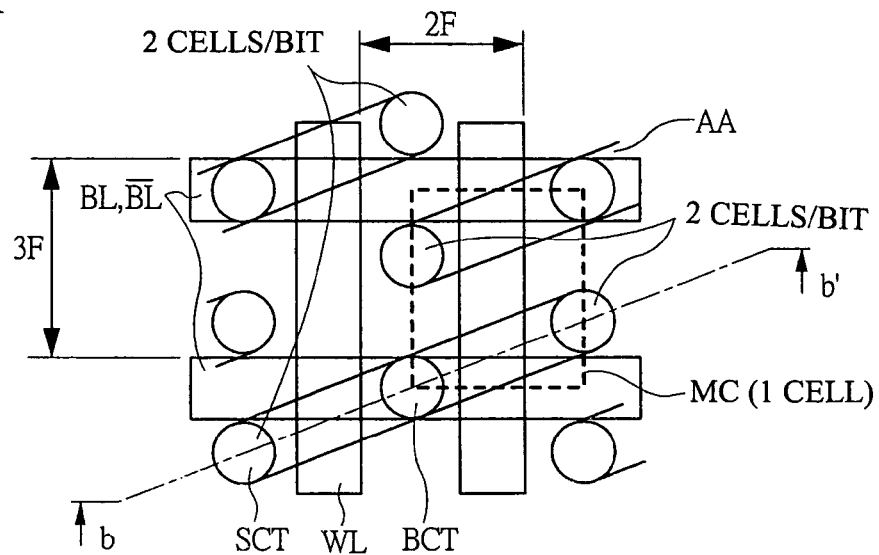
FIG. 1A is a schematic plan view showing a twin cell structure of a memory cell in a semiconductor memory device according to an embodiment of the present invention.
Figure 1B:
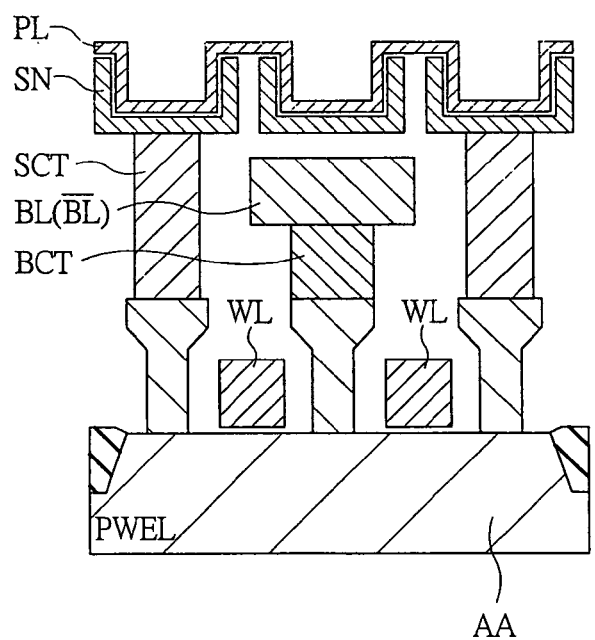
FIG. 1B is a schematic cross-sectional view showing a twin cell structure of a memory cell in a semiconductor memory device according to an embodiment of the present invention.

1. Twin Cell Structure Employing One-intersection $6F^2$ Cell 1-1. Twin Cell Structure of Memory Cell FIGS. 1A and 1B are drawings showing a twin cell structure of a memory cell and are a schematic plan view and a schematic sectional view, respectively. Note that FIG. 1B is illustrated in view of a capacitor to be formed on the upper layer thereof in a sectional structure taken along the line b–b' in FIG. 1A and also an illustration of an insulating film is omitted. In this case, an example where the one-intersection $6F^2$ cell is used will be described.

As shown in FIG. 1, in the twin cell structure employing the one-intersection $6F^2$ cell, memory cells MC are arranged at positions corresponding to all of the intersections between the bit-line pairs BL and /BL and the word lines WL, the area of one cell is $6F^2$ (2F×3F), and the area of the two cells/bit is $12F^2$.

This twin cell structure comprises: a plurality of folded-type bit-line pairs BL and /BL arranged in parallel to each other; a plurality of word lines WL orthogonal to the plurality of bit-line pairs BL and /BL; dynamic type memory cells MC, which are composed of one transistor and one capacitor and arranged in matrix at positions corresponding to the intersections between the plurality of bit-line pairs BL and /BL and the plurality of the word lines WL; and the like. Note that the portion corresponding to one cell of the memory cell MC is shown by the dash lines.

In the memory cell MC, the plate PL to be one electrode of the capacitor is connected to a common electrode together with one electrode of each of other plurality of capacitors arranged in matrix, and a storage node SN to be the other electrode of the capacitor is connected to a source electrode of the transistor, and a drain electrode of the transistor is connected to the bit-line pair BL and /BL, and a gate electrode of the transistor is connected to the word line WL.

Particularly, in this twin cell structure, the bit-line pitch of the bit-line pair BL and /BL is larger than 2F and smaller than 4F when the half pitch of the word line WL is defined as F. The example where the pitch of the word line WL is 2F and those of the bit line BL and /BL are 3F is shown in FIG. 1A.

Active regions AA on the silicon substrate, in which the source, channel and drain of the transistor of the memory cell MC are formed, are obliquely formed relative to a direction of the bit-line pairs BL and /BL.

Also, the capacitor is formed above the bit-line pair BL and /BL via an insulating film. Additionally, a wiring layer forming the word line WL is composed of, for example, a laminated film of polysilicon and metal, or a metal film. A wiring layer for forming the bit-line pair is composed of, for example, a metal film.

More concretely, in the twin cell structure as shown in FIG. 1B, the transistor of the memory cell MC is formed on the active region AA in the P well PWEL of the silicon substrate, wherein: the gate electrode is connected to the word line WL; the source electrode is connected via the storage node contact SCT to the storage node SN to be the other electrode of the capacitor; and the drain electrode is connected via the bit contact BCT to the bit-line pair BL and /BL. The storage node SN is arranged at a position opposite to the upper portion thereof, and constitutes the capacitor between other plurality of capacitors and a plate PL to be one electrode common thereto.

Note that, though not shown, a circuit, which performs the writing of the memory information to the memory cell MC, the readout of the memory data from the memory cell MC, or the refresh of the memory information of the memory cell MC in response to the plurality of bit line pairs BL and /BL, is connected to the plurality of bit-line pairs BL and /BL.

1-2. Another Twin Cell Structure of Memory Cell

Figure 2A:
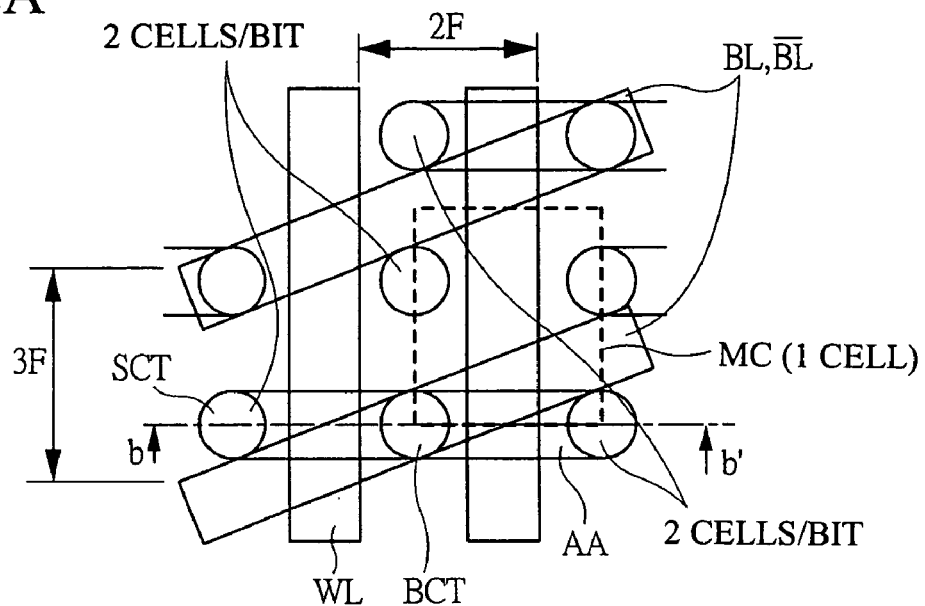
FIG. 2A is a schematic plan view showing another twin cell structure of a memory cell in a semiconductor memory device according to an embodiment of the present invention.
Figure 2B:
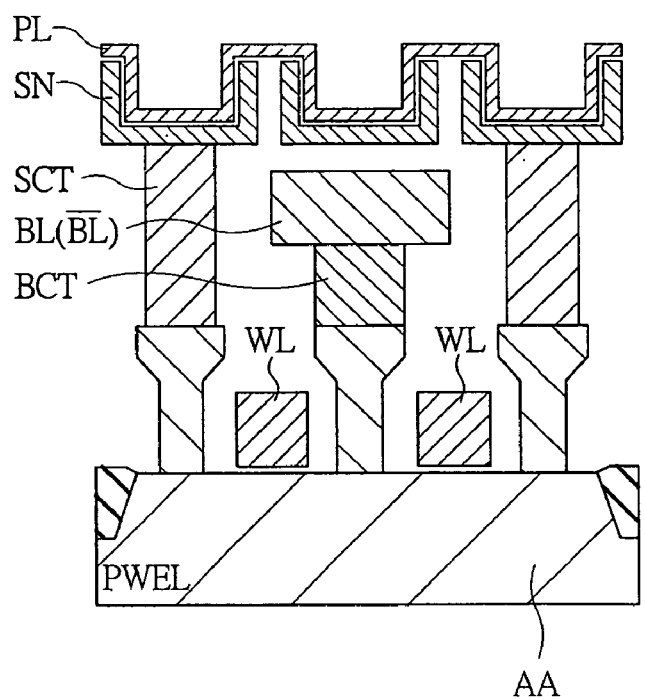
FIG. 2B is a schematic cross-sectional view showing another twin cell structure of a memory cell in a semiconductor memory device according to an embodiment of the present invention.

FIGS. 2A and 2B show another twin cell structure of a memory cell, and are a schematic plan view and a schematic sectional view, respectively. Note that FIG. 2B is illustrated in view of a capacitor to be formed on the upper layer in a sectional structure taken along the line b–b' in FIG. 2A and an illustration of an insulating film is omitted. In this case, an example where the one-intersection $6F^2$ cell is used will be described.

As shown in FIGS. 2A and 2B, in the twin cell structure employing the one-intersection $6F^2$ cell, similarly to FIGS. 1A and 1B, the memory cells MC are arranged at positions corresponding to all of the intersections between the bit-line pairs BL and /BL and the word lines WL, and the area of one cell is $6F^2$ (2F×3F), and the area of the two cells/bit is $12F^2$. However, the structure in FIGS. 2A and 2B is different from that in FIGS. 1A and 1B in the arrangement of the bit-line pairs BL and /BL and the active regions AA relative to the word lines WL.

More specifically, the twin cell structure in FIGS. 2A and 2B is constituted to include: the plurality of folded-type bit-line pairs BL and /BL arranged in parallel to each other; the plurality of word lines WL not orthogonal to the plurality of bit-line pairs BL and /BL; the dynamic memory cells MC composed of one transistor and one capacitor and arranged in matrix at positions corresponding to the intersections between the plurality of bit-line pairs BL and /BL and the plurality of the word lines WL; and the like. In this structure, the plurality of word lines WL and the active regions AA are orthogonal, and the bit-line pairs BL and /BL are obliquely formed relative to the direction of the active regions AA.

Particularly, also in this twin cell structure, the pitch of the bit-line pair BL and /BL is larger than 2F and smaller than 4F when the half pitch of the word line WL is defined as F. The example, in which the pitch of the word line WL is 2F and that of each of the bit lines BL and /BL is 3F, is shown in FIGS. 2A and 2B. Since other structure is the same as that in FIGS. 1A and 1B, the detailed description thereof is omitted here.

1-3. Connection Configuration Between Bit-line Pair and Sense Amplifier

Figure 3B:
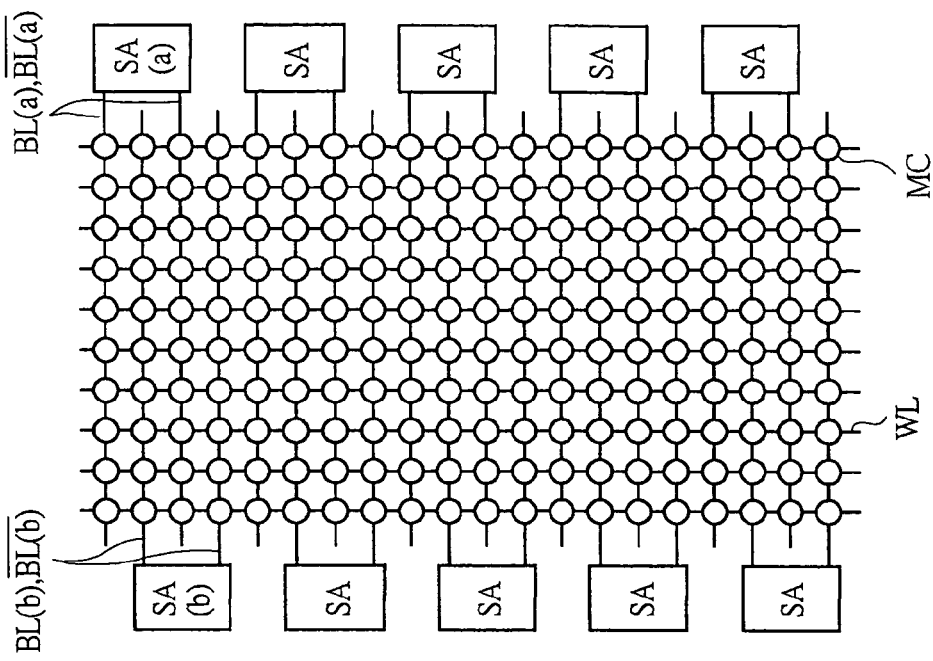
FIG. 3B is a connection diagram showing another connection configuration between bit-line pairs and sense amplifiers in a semiconductor memory device according an embodiment of the present invention.
Figure 3A:
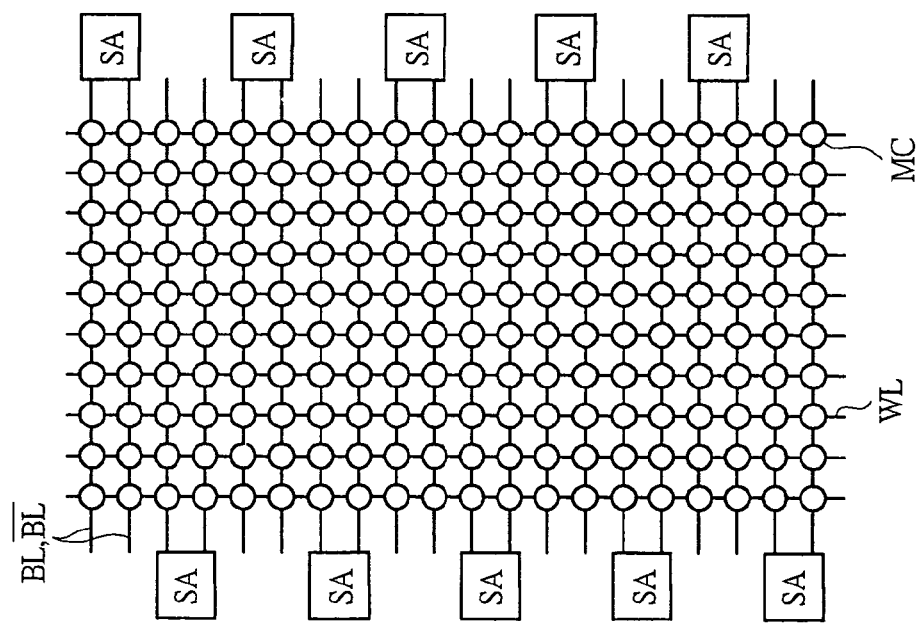
FIG. 3A is a connection diagram showing a connection configuration between bit-line pairs and sense amplifiers in a semiconductor memory device according an embodiment of the present invention.

FIGS. 3A and 3B are connection diagrams showing the connection configuration between the bit-line pairs and the sense amplifiers, and exemplify the cases where the bit-line pair is composed of the bit lines adjacent thereto and where the bit-line pair is composed of the bit lines not adjacent thereto, respectively.

As shown in FIG. 3A, in the case where the bit-line pair BL and /BL is composed of the adjacent bit lines, the bit lines BL and /BL are arranged side by side and these two bit lines function as a bit-line pair BL and /BL and are connected to the sense amplifier SA. There are the plurality of bit-line pairs BL and /BL connected in this manner and the sense amplifier SA is connected to each of them. These sense amplifiers SA are alternately arranged on the right and left ends of the bit-line pairs BL and /BL. Also, the memory cells MC are arranged at all of the intersections between the bit-lines BL and /BL and the word lines WL.

As shown in FIG. 3B, in the case where the bit-line pair BL and /BL is composed of the unadjacent bit lines, the bit lines BL and /BL are arranged every other line without adjacency, and these two bit lines function as a bit-line pair BL and /BL and are connected to the sense amplifier SA. There are the plurality of bit-line pairs BL and /BL connected in this manner and the sense amplifiers SA are alternately arranged and connected to the right and left ends of each of the bit-line pairs BL and /BL. For example, in FIG. 3B, a bit line BL(a), a bit line BL(b), a bit line /BL(a), a bit line /BL(b), . . . are arranged in this order, and the bit lines BL(a) and /BL(a) are connected to the sense amplifier SA(a) on the right end and the bit lines BL(b) and /BL(b) are connected to the sense amplifier SA(b) on the left end.

1-4. Connection Configuration of Word Line

Figure 4B:
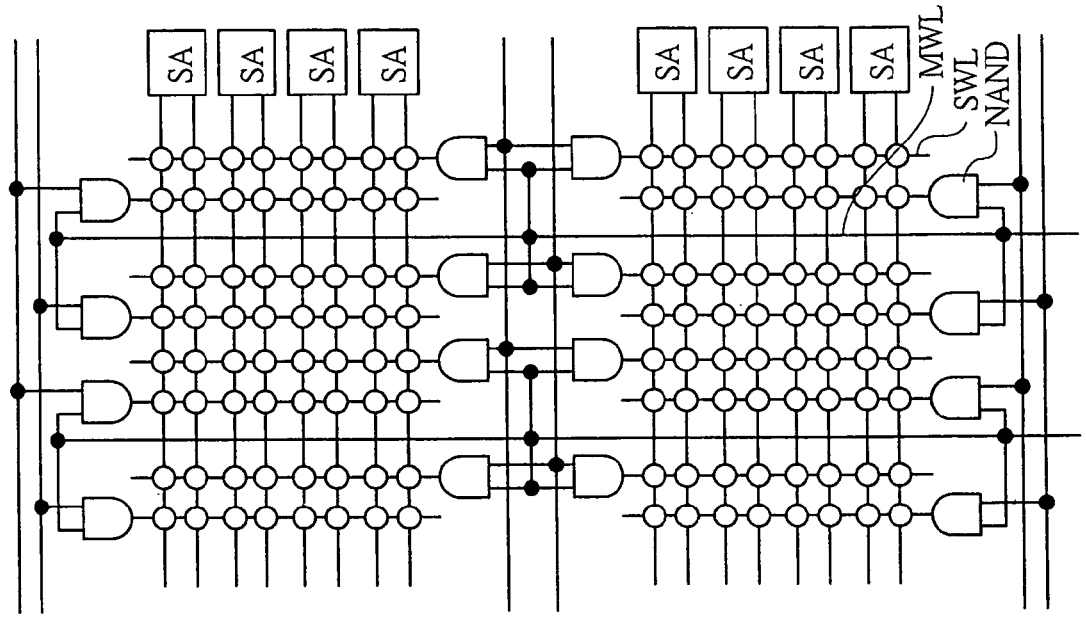
FIG. 4B is a connection diagram showing another connection configuration of word lines in a semiconductor memory device according an embodiment of the present invention.
Figure 4A:
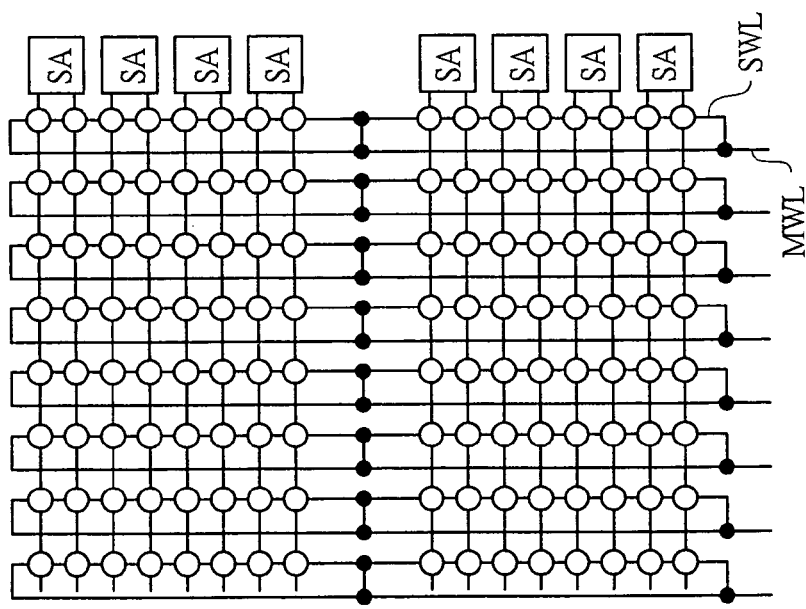
FIG. 4A is a connection diagram showing a connection configuration of word lines in a semiconductor memory device according an embodiment of the present invention.

FIGS. 4A and 4B are connection diagrams showing the connection configuration of the word lines, and respectively exemplify the cases where the word lines include main word lines and secondary word lines each having a backed structure, and where the word lines include main word lines and secondary word lines, the secondary word line being driven in response to the signal of the main word line.

As shown in FIG. 4A, in the case where the word lines WL include the main word lines MWL and secondary word lines SWL each having a backed structure, the word lines WL are constituted by: the secondary word lines SWL composed of a wiring layer for forming the gate electrode of the transistor of the memory cell MC; and the main word lines MWL which back the secondary word line SWL at several points and are composed of a wiring layer other than that of the secondary word line SWL. For example, in FIG. 4A, the secondary word line SWL is backed by the main word line MWL at every eight memory cells MC connected to the four bit-line pairs BL and /BL.

As shown in FIG. 4B, in the case where the word lines WL include main word lines MWL and secondary word lines SWL and the secondary word line SWL is driven in response to the signal of the main word line MWL, the word lines WL are formed by: the relatively long main word lines MLW; and the relatively short secondary word lines SWL which are driven by a driving circuit for receiving the signal of the main word line MWL and constitute the gate electrode of the transistor of the memory cell MC. For example, in FIG. 4B, a driving circuit including a gate circuit NAND is arranged at every eight memory cells MC connected to the four bit-line pairs BL and /BL, and each of the memory cells MC connected to the secondary word lines SWL is driven by the driving circuit. The signals from the main word line MWL and the driving control signal are inputted to the gate circuit NAND of the driving circuit.

According to the twin cell structure employing the one-intersection $6F^2$ cell as described above, the following advantages can be obtained.

(1) Because of the $6F^2$ cell structure, the area of the one bit is not more than $12F^2$. Therefore, the area of the memory cell MC is reduced by about 25% in comparison to that of the two cells of the $8F^2$ cell structure with the same F value. More specifically, if the pitch of the bit-line pair BL and /BL is smaller than 4F, there is the area-reducing effect thereof larger than that of the two cells of the $8F^2$ cell structure. In general, if the F values are equal, easiness of the fabricating of the memory cells MC is also equal.

(2) The simultaneous selection of the two memory cells connected to all of the bit-line pairs BL and /BL becomes possible by activating only one word line WL. In contrast, in the case of the $8F^2$, the activation of two word lines WL is needed. Accordingly, there are the advantages of the reduction in power noises and power consumption due to the reduction of a load current at the time of selecting the word line WL.

Also, the following advantages can be achieved in comparison to a method for enlarging the area of the memory cell MC to increase signal charge amounts (folded bit line/open bit line double method).

(1) In the operation of the folded bit line method, the completely symmetric structure thereof can be attained. This is because the memory cells MC are provided at all of the intersections between the bit-line pairs BL and /BL and the word lines WL. In this manner, it is possible to completely cancel array noises including the noises of the non-selected word line. Further, the bit-line capacitance including the capacitors is completely balanced also in amplifying the bit line. Accordingly, it is possible to realize the speed-up and stability of a reading operation from the memory cell MC.

(2) It is always possible to maintain data at both voltage levels of "H"/"L" regardless of the "0"/"1" of the data. This can provide high resistance to a junction leakage, so that margins at the high-speed (=high-temperature) operation can be enlarged. Further, since soft error resistance is improved, it is advantageous in applications to an ultra high-speed operation such as cache.

(3) It is always possible to simultaneously read both the signals of "H"/"L" regardless of "0"/"1" of the data. Accordingly, due to the small data pattern dependency, the stable and high-speed operation can be performed.

As described above, according to the twin cell structure employing the one-intersection $6F^2$ cell, it is possible to provide the minimum memory cell area among those that can realize the equivalent performance.

2. Direct Sense+Twin Cell Method 2-1. Direct Sense+Twin Cell Method

Figure 5A:
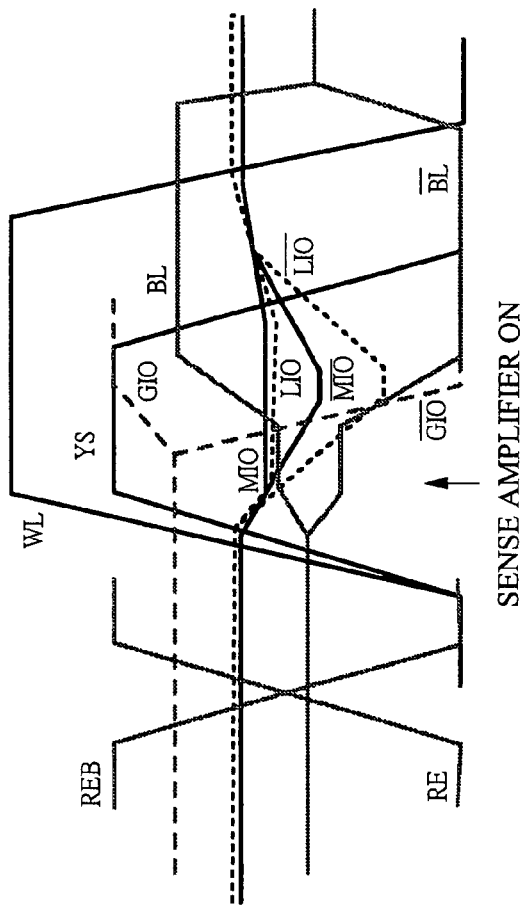
FIG. 5A is a waveform diagram showing a direct sense+twin cell method in a semiconductor memory device according to an embodiment of the present invention.
Figure 5B:
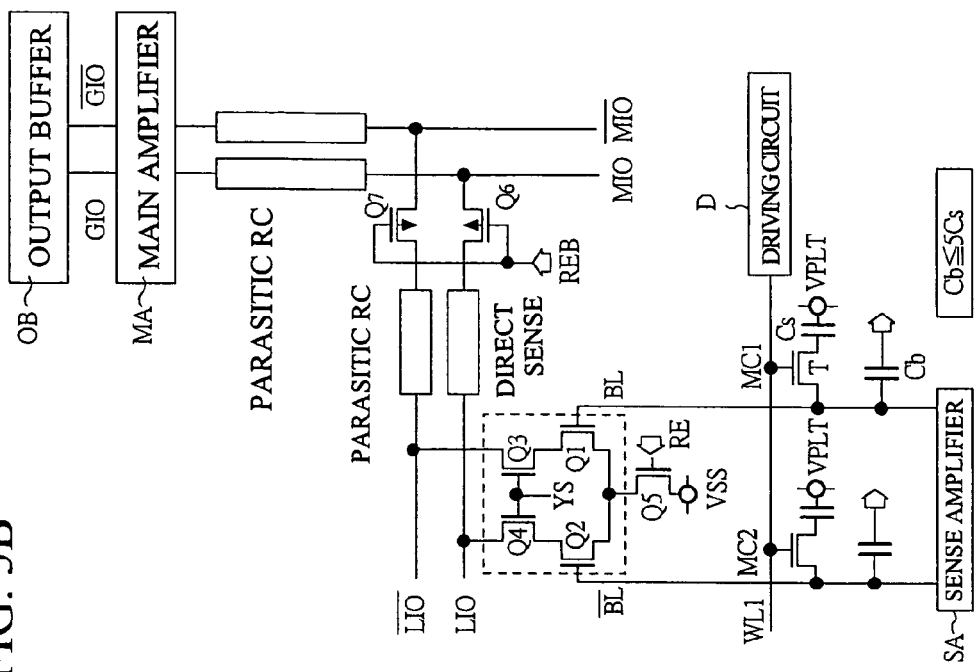
FIG. 5B is a circuit diagram showing a direct sense+twin cell method in a semiconductor memory device according to an embodiment of the present invention.

FIGS. 5A and 5B are views showing a direct sense+twin cell method, and illustrate a waveform diagram and a circuit diagram thereof, respectively.

As shown in FIGS. 5A and 5B, the direct sense+twin cell method is constituted so that: the word line WL and a column-selection line YS are almost simultaneously selected; a readout signal is transmitted to data-line pairs (local I/O lines LIO and /LIO and main I/O lines MIO and /MIO) before the amplification in the sense amplifier SA; and the amplification of global I/O lines GIO and /GIO is started before the amplification in the sense amplifier SA.

As shown in FIG. 5B, this direct sense+twin cell method has one transistor T and one capacitor Cs, and is constituted to include: a plurality of dynamic memory cells MC to be simultaneously selected; the bit-line pair BL and /BL to which the plurality of selected memory cells MC are connected; the sense amplifier SA which amplifies the potential of the bit-line pair BL and /BL to a predetermined "H" and "L" levels; and a pair of MOSFETs Q1 and Q2 having gates to which the respective bit-line pair BL and /BL are inputted and drains connected to the data-line pair (LIO and /LIO).

Furthermore, the drains of the pair of MOSFETs Q1 and Q2 is respectively connected to the sources of a pair of MOSFETs Q3 and Q4 whose gates are driven by the column-selection line YS, and the sources thereof are connected to the drain of a MOSFET Q5 commonly driven by a read-enable control line RE. Also, the drains of the pair of MOSFETs Q3 and Q4 are connected to the local I/O lines LIO and /LIO, respectively. Further, the source of the MOSFET 5 is connected to the ground potential VSS. These plurality of MOSFETs Q1 to Q5 functioning as a direct sense circuit are composed of a differential amplifier which transmits, to the local I/O lines LIO and /LIO, the signal being read from the bit-line pair BL and /BL.

The local I/O lines LIO and /LIO connected to the direct sense circuit are further connected to the main I/O lines MIO and /MIO via a pair of MOSFETs Q6 and Q7 driven by the read-enable control line REB. This main I/O lines MIO and /MIO are connected to a main amplifier MA and further connected to an output buffer OB via global I/O lines GIO and /GIO.

Also, the gates of the plurality of memory cells MC, each composed of one transistor T and one capacitor Cs and selected simultaneously, are connected to the same word line WL. Furthermore, the word line WL is connected to a driving circuit D, and the plurality of memory cells MC are controlled by the driving circuit D through the same word line WL. For example, as shown in FIG. 5B, the memory cell MC1 is connected to the intersection between one bit line BL of the bit-line pair and the word line WL1, and the memory cell MC2 is connected to the intersection between the other bit line /BL of the bit-line pair and the same word line WL1.

Note that parasitic capacitance Cb is included in the bit-line pair BL and /BL, and the parasitic capacitor Cb is set to about five times as large as the capacitance of the capacitor Cs or smaller. Also, the elements of parasitic resistance and parasitic capacitance are included also in the local I/O lines LIO and /LIO and the main I/O lines MIO and /MIO.

The direct sense+twin cell method has, as shown in FIG. 5A, a readout operation of: starting up the read-enable control line RE (the read-enable control line REB is started down); sequentially starting up the word line WL and the column-selection line YS to simultaneously select the plurality of memory cells MC; reading out the signal from the plurality of memory cells MC to the bit-line pair BL and /BL corresponding to the plurality of memory cells MC; and transmitting, to the local I/O lines LIO and /LIO and the main I/O lines MIO and /MIO, the signal read out at the bit-line pair BL and /BL before the amplification by the sense amplifier SA connected to the bit-line pair BL and /BL. The signal read out from the plurality of memory cells MC includes both pieces of complementary data corresponding to "1" and "0".

Additionally, before the signal read out at the bit-line pair BL and /BL is amplified by the sense amplifier SA, the amplification of the signal transmitted to the main I/O lines MIO and /MIO is started by the main amplifier MA connected to the main I/O lines MIO and /MIO. Then, the signal is transmitted from the main amplifier MA to the output buffer OB via the global I/O lines GIO and /GIO and outputted from the output buffer OB.

2-2. Another Direct Sense+Twin cell Method

Figure 6B:
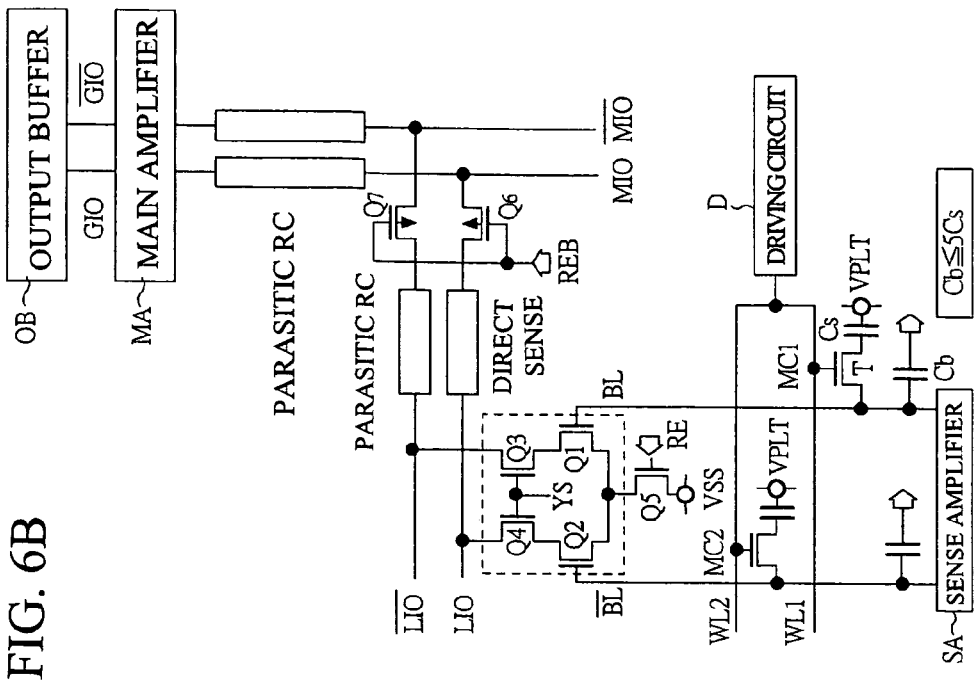
FIG. 6B is a circuit diagram showing another direct sense+twin cell method in a semiconductor memory device according to an embodiment of the present invention.
Figure 6A:
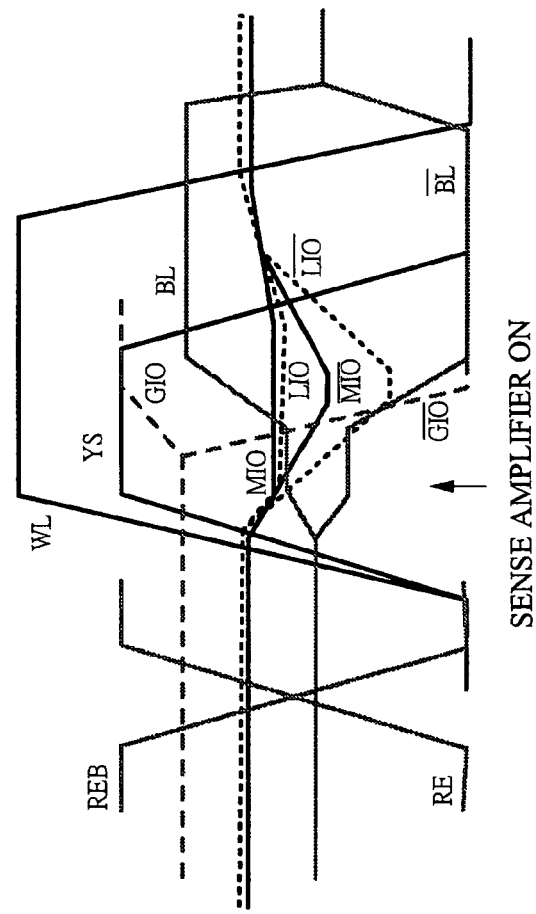
FIG. 6A is a waveform diagram showing another direct sense+twin cell method in a semiconductor memory device according to an embodiment of the present invention.

FIGS. 6A and 6B show another direct sense+twin cell method, and are a waveform diagram and a circuit diagram thereof, respectively.

As shown in FIGS. 6A and 6B, in another direct sense+twin cell method, similarly to FIGS. 5A and 5B, the word line WL and the column-selection line YS are almost simultaneously selected, the readout signal is transmitted to the data-line pair (local I/O lines LIO and /LIO and main I/O lines MIO and /MIO) before the amplification by the sense amplifier SA, and the amplification of the global I/O lines GIO and /GIO is started before the amplification by the sense amplifier SA. However, the constitution in FIGS. 6A and 6B is difference from that in FIGS. 5A and 5B in the control of the memory cell MC by the word line WL.

More specifically, in the direct sense+twin cell method shown in FIG. 6, each gate of the plurality of memory cells MC selected simultaneously and composed of one transistor T and one capacitor Cs is connected to the plurality of word lines WL. Furthermore, the word lines WL are connected to the driving circuit D, and the plurality of memory cells MC are controlled by the driving circuit D through the plurality of word lines WL. For example, as shown in FIG. 6, the memory cell MC1 is connected to the intersection between one bit line BL of the bit-line pair and the word line WL1, and the memory cell MC2 is connected to the intersection between the other bit line /BL of the bit-line pair and another word line WL2.

As shown in FIG. 6B, since the readout operation of this direct sense+twin cell method is identical to that shown in FIG. 5, the description thereof is omitted here.

2-3. Method of Simultaneous Selection of a Plurality of Memory Cells

FIGS. 7A to 7F is each a connection diagram showing the method of the simultaneous selection of a plurality of memory cells. FIGS. 7A, 7B, 7c, 7D, 7E and 7F show a two-cell simultaneous selection method, another two-cell simultaneous selection method, still another two-cell simultaneous selection method, a four-cell simultaneous selection method, another four-cell simultaneous selection method, and still another four-cell simultaneous selection method, respectively.

The example in FIG. 7A illustrates the case where one word line WL is to be a selection object, in the structure in which each bit-line pair BL and /BL is connected to one side of each sense amplifier SA and the memory cells MC are connected to all of the intersections between the bit-line pairs BL and /BL and the word lines WL, respectively. In this case, for example, the two memory cells MC11a and MC11b, each connected to the bit-line pair BL1 and /BL1, are simultaneously selected by the same word line WL1.

The example in FIG. 7B illustrates the case where two word lines WL, each one end of which is commonly connected, are to be the selection objects, in the structure in which each bit-line pair BL and /BL is connected to one side of each sense amplifier SA and the memory cells MC are connected to half of the intersections between these bit-line pairs BL and /BL and the word lines WL, respectively. In this case, for example, the two memory cells MC11 and MC21, connected respectively to the bit line BL1 and /BL1, are simultaneously selected by the two word lines WL1 and WL2, each one end of which is commonly connected.

The example in FIG. 7C illustrates the case where two word lines WL, each arranged on both sides of each of the sense amplifiers, are to be selection objects, in the structure in which each bit-line pair BL and /BL is connected to both sides of each sense amplifier SA and the memory cells MC are connected to all of the intersections between the bit-line pairs BL and /BL and the word lines WL, respectively. In this case, for example, the two memory cells MC11 and MC21, each connected to the bit-line pair BL1 and /BL1, are simultaneously selected by the two word lines WL1 and WL2, each of which is arranged on both sides of each sense amplifier.

The example in FIG. 7D illustrates the case where one word line WL is to be a selection object, in the structure in which each folded-type bit-line pair BL and /BL is connected to one side of each sense amplifier SA and the memory cells MC are connected to all of the intersections between the folded-type bit-line pairs BL and /BL and the word lines WL, respectively. In this case, for example, the four memory cells MC11a, MC11b, MC11c, and MC11d, each connected to the folded-type bit-line pair BL1 and /BL1, are simultaneously selected by the same word line WL1.

The example in FIG. 7E illustrates the case where two word lines WL, each one end of which is commonly connected, are to be selection objects, in the structure in which each bit-line pair BL and /BL is connected to one side of each sense amplifier SA and the memory cells MC are connected to all of the intersections between the bit-line pairs BL and /BL and the word lines WL, respectively. In this case, for example, the four memory cells MC11a, MC11b, MC21a, and MC21b, each connected to the bit-line pair BL1 and /BL1, are simultaneously selected by the two word lines WL1 and WL2, each one end of which is commonly connected.

The example in FIG. 7F illustrates the case where four word lines WL, each one end of which is commonly connected, are to be selection objects, in the structure in which each bit-line pair BL and /BL is connected to one side of each sense amplifier SA and the memory cells MC are connected to half of the intersections between the bit-line pairs BL and /BL and the word lines WL, respectively. In this case, for example, the four memory cells MC11, MC21, MC31, and MC41, each connected to the bit-line pair BL1 and /BL1, are simultaneously selected by the four word lines WL1, WL2, WL3, and WL4, each one end of which is commonly connected.

2-4. Main Amplifier With Threshold-voltage-offset Compensation Function

Figure 8A:
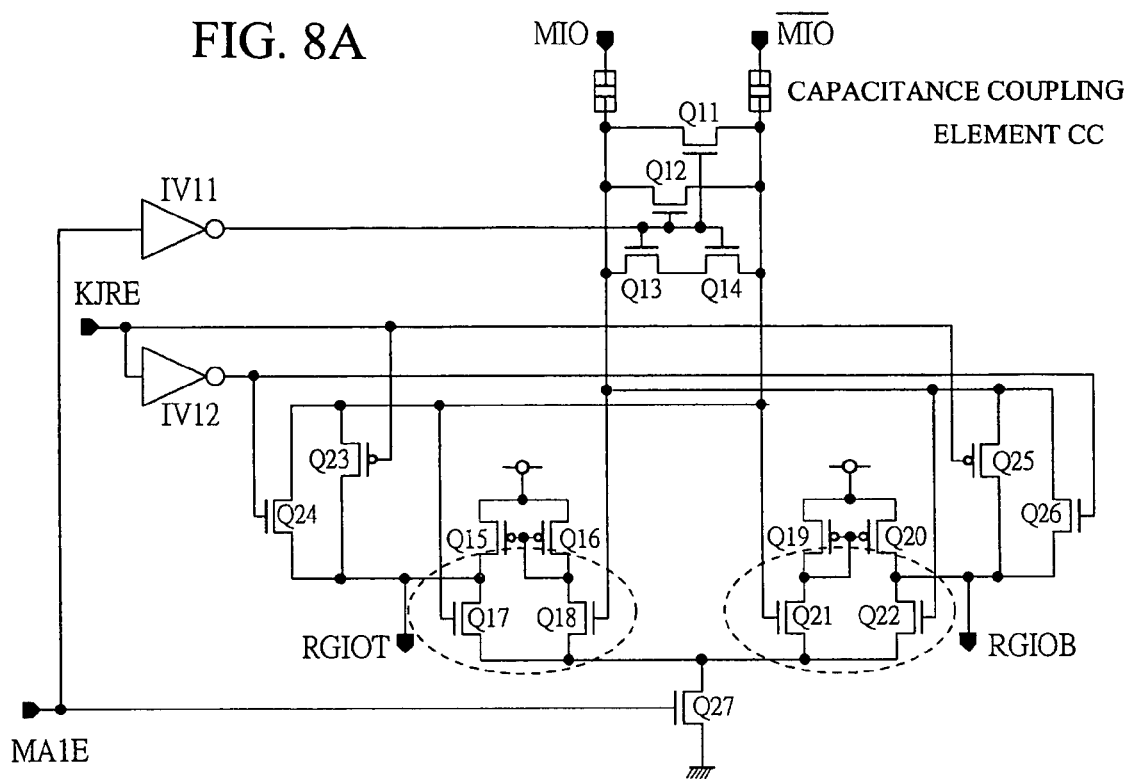
FIG. 8A is a circuit diagram showing a preamplifier of a main amplifier with a threshold-voltage offset compensation function in a semiconductor memory device according to an embodiment of the present invention.
Figure 8B:
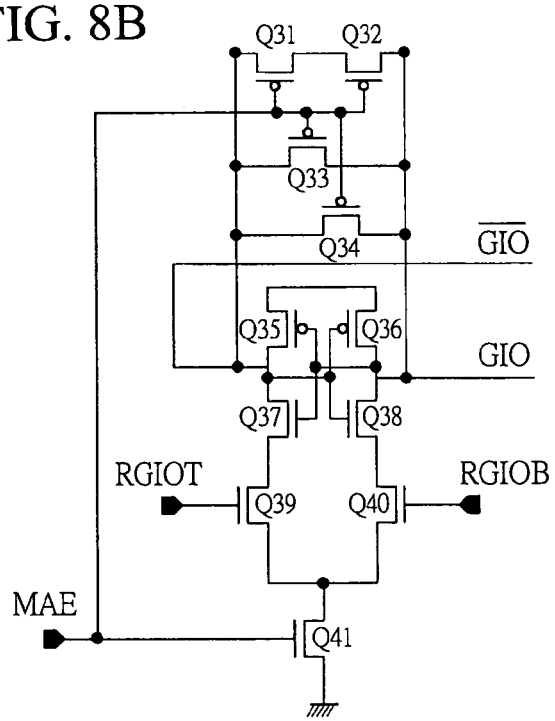
FIG. 8B is a circuit diagram showing a latch-type amplifier of a main amplifier with a threshold-voltage offset compensation function in a semiconductor memory device according to an embodiment of the present invention.
Figure 9:
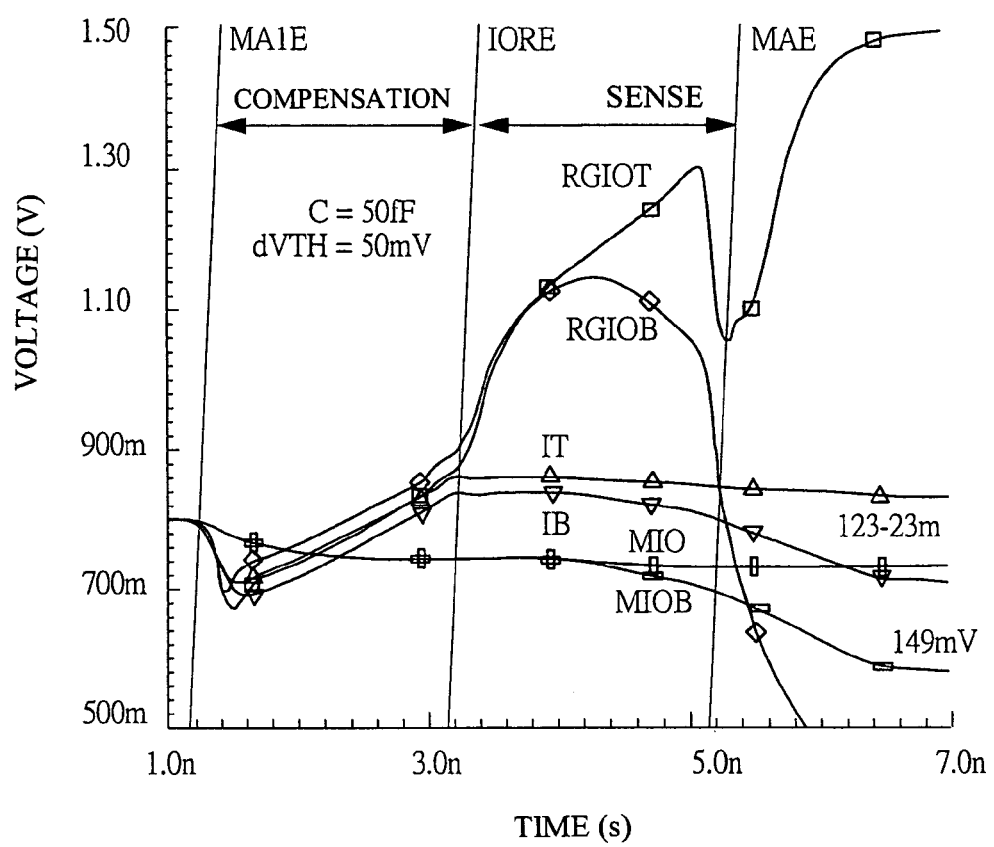
FIG. 9 is a waveform diagram showing an operation of a main amplifier with a threshold-voltage offset compensation function in a semiconductor memory circuit according to an embodiment of the present invention.
Figure 10:
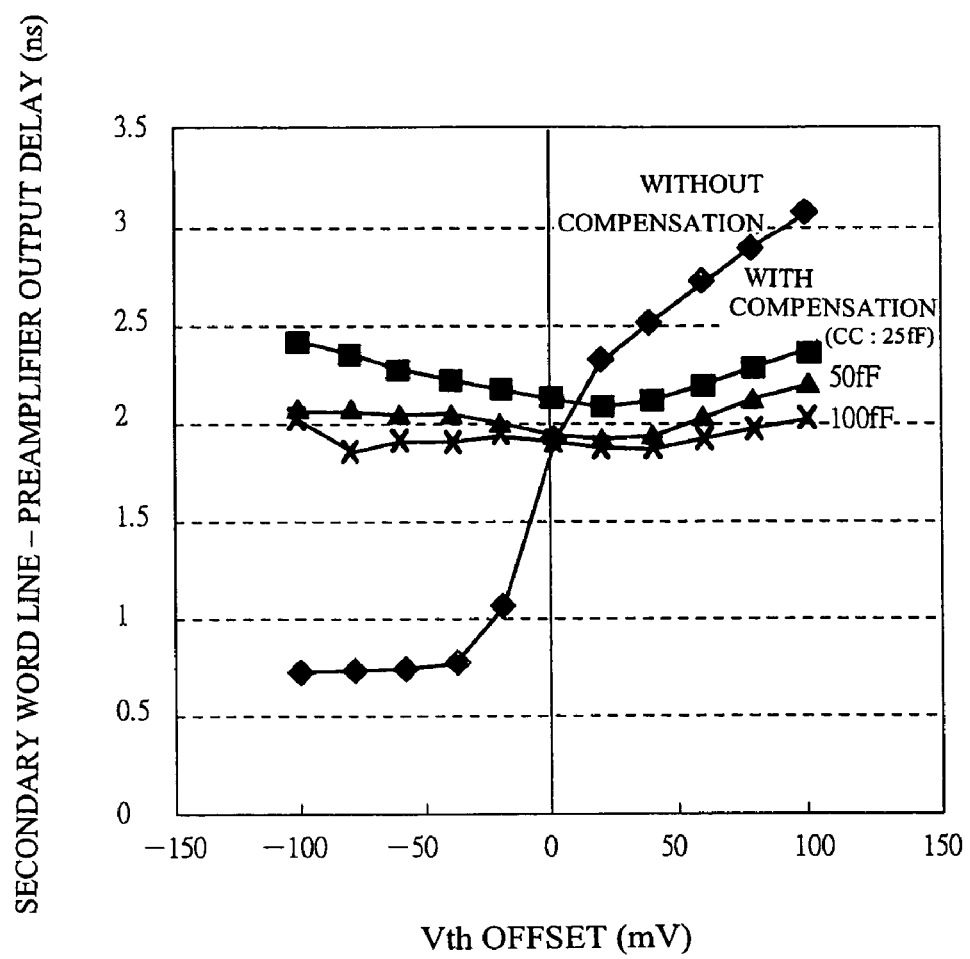
FIG. 10 is a characteristic diagram showing an effect of threshold-voltage offset compensation in a semiconductor memory device according to an embodiment of the present invention.

FIGS. 8A and 8B each show a main amplifier with a threshold-voltage-offset compensation function. FIGS. 8A and 8B are a circuit diagram of a preamplifier and a circuit diagram of a latch-type amplifier, respectively. FIG. 9 is a waveform diagram showing the operation of the main amplifier with a threshold-voltage-offset compensation function. FIG. 10 is a characteristic diagram showing threshold-voltage-offset compensation effect in the preamplifier.

The main amplifier with a threshold-voltage-offset compensation function comprises: a latch-type amplifier; and a static preamplifier, particularly, a differential amplifier and a compensation circuit having an operation of compensating the characteristic difference in a pair transistor receiving a differential input.

As shown in FIG. 8A, the static preamplifier comprises: a precharge circuit composed of MOSFETs Q11 to Q14; capacitance coupling elements (CC); a pair of static differential amplifiers composed of MOSFETs Q15 to Q18 and Q19 to Q22; an offset compensation circuit composed of MOSFETs Q23 to Q26; a driving MOSFET Q27; and inverters IV11 and IV12, wherein signals from main I/O lines MIO and /MIO, control line MA1E, and control line KJRE are used as inputs and the signals are outputted to signal lines RGIOT and RGIOB. For the static amplifier, the pair MOSFET Q17 and Q18 and the pair MOSFET Q21 and Q22 in the differential amplifier make offset compensation. More specifically, the input and output of the differential amplifier are short-circuited by the MOSFETs Q23 and Q24 and the MOSFETs Q25 and Q26, whereby the input is biased to a logic threshold voltage whose offset is compensated.

As shown in FIG. 8B, the latch-type amplifier comprises: a precharge circuit composed of MOSFETs Q31 to Q34; a latch circuit composed of MOSFETs Q35 to Q41; and the like, wherein signals from signal lines RGIOT and RGIOB and a control line MAE are used as inputs and the signal is outputted to the global I/O lines GIO and /GIO. The offset compensation for the latch-type amplifier is not made, wherein the latch-type amplifier is latched at a point where the output of the preamplifier is equal to or more than the offset of the latch-type amplifier.

With respect to the change in voltage (v) of each signal in the main I/O lines MIO and /MIO (MIOB), the signal lines RGIOT and RGIOB, and the control lines IT and IB relative to the passage of time (s) as shown in FIG. 9, the main amplifier with a threshold-voltage-offset compensation function has the operation of: making the offset compensation within a range from about 1.0 ns to about 3.0 ns; and having the sense operation period of the range from about 3.0 ns to about 5.0 ns.

FIG. 10 shows the effect of the threshold-voltage-offset compensation of the main amplifier. More specifically, if there is no compensation function, the output delay between the secondary word line and the preamplifier widely varies from about 0.7 ns to about 3.1 ns within the range of the threshold-voltage offset value (Vth) between −100 mV and +100 mV using its reference as 0 mV. In contrast, if there is the compensation function, it is possible, in the example of the coupling capacitance (CC) having 25 fF, to reduce the output delay between the secondary word line and the preamplifier to small variations from about 2.4 ns to about 2.1 ns within the range of the threshold-voltage-offset value between −0.1 mV and +0.1 mV, thereby allowing for obtaining almost constant output delay. Also in the examples of 50 fF and 100 fF, it is possible to reduce its output delay to variations in the range of about 0.3 ns, thereby allowing for obtaining almost constant output delay.

2-5. Direct Sense Circuit with Threshold-voltage-offset Compensation Function

Figure 11:
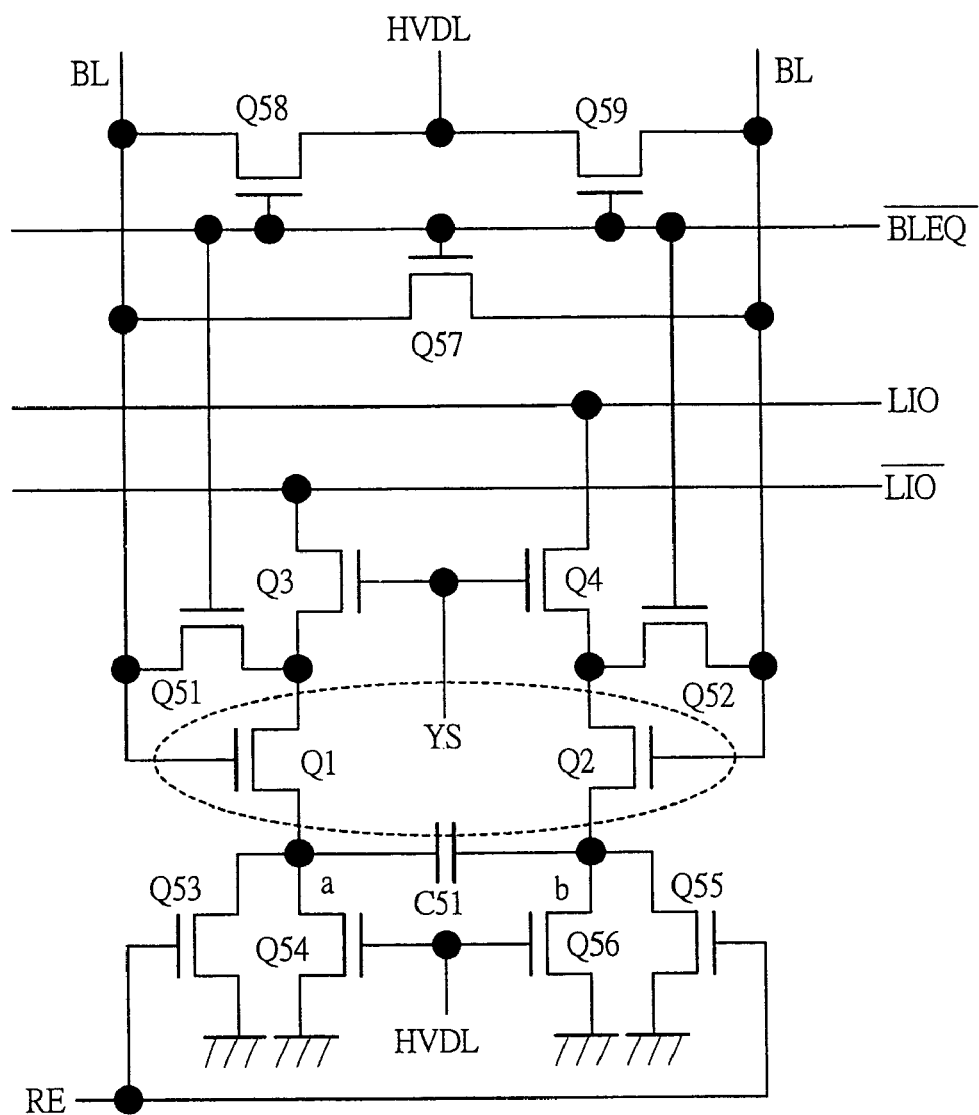
FIG. 11 is a circuit diagram showing a direct sense circuit with a threshold-voltage offset compensation function in a semiconductor memory device according to an embodiment of the present invention.
Figure 12B:
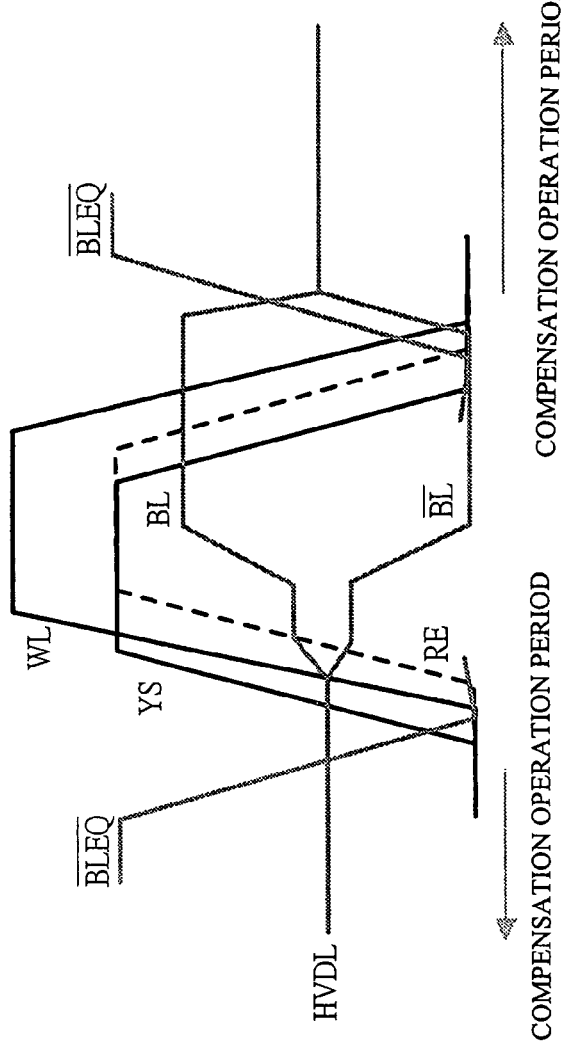
FIG. 12B is a waveform diagram showing the compensation operation of a direct sense circuit with a threshold-voltage offset compensation function in a semiconductor memory device according to an embodiment of the present invention.
Figure 12A:
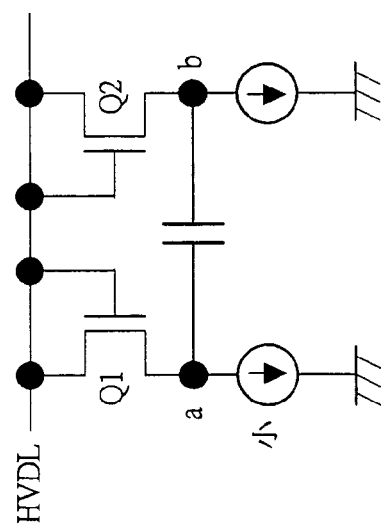
FIG. 12A is a circuit diagram showing the principal part of the compensation operation of a direct sense circuit with a threshold-voltage offset compensation function in a semiconductor memory device according to an embodiment of the present invention.

FIG. 11 is a circuit diagram showing a direct sense circuit with a threshold-voltage-offset compensation function. FIGS. 12A and 12B each show the compensation operation of the direct sense circuit, and are a circuit diagram showing the principal part thereof and a waveform diagram showing the compensation operation, respectively.

The direct sense circuit with a threshold-voltage-offset compensation function has a structure in which a differential amplifier composed of particularly a pair of MOSFETs etc. is added to a compensation circuit that operates to compensate the characteristic difference in the pair transistor receiving the differential input.

As shown in FIG. 11, the direct sense circuit with a threshold-voltage-offset compensation function is composed of: a pair of MOSFETs Q1 and Q2; MOSFETs Q3 and Q4 connected between the MOSFETs Q1 and Q2 and the local I/O lines LIO and /LIO; MOSFETs Q51 and Q52 connected between them and the bit-line pair BL and /BL; and two pairs of MOSFETs Q53 to Q56 connected between them and the ground potential. Additionally, a capacitor C51 is connected between a node a to which the MOSFETs Q53 and Q54 are commonly connected and a node b to which the MOSFETs Q55 and Q56 are commonly connected.

The MOSFETs Q1 and Q2, the gates of which are respectively connected to the bit-line pair BL and /BL, are driven. The MOSFETs Q3 and Q4, the gates of which are connected to the column-selection line YS, are driven. The MOSFETs Q51 and Q52, the gates whose are connected to the bit-line equalize-control line /BLEQ, are driven. Of the two pairs of the MOSFETs Q53 to Q56, the MOSFETs-Q53 and Q55 are connected to the read-enable control line RE and driven, and the MOSFETs Q54 and Q56 are connected to a potential HVDL and driven.

Particularly, in the direct sense circuit with a threshold-voltage-offset compensation function, the two pairs of MOSFETs Q53 to 56 are connected between the pair of MOSFETs Q1 and Q2 and the ground potential, and these MOSFETs Q53 to Q56 and Q51 and Q52, etc. operate to compensate the threshold-voltage characteristic difference in the MOSFETs Q1 and Q2 receiving the differential input from the bit-line pair BL and /BL. Consequently, the difference between the threshold voltages of the MOSFET Q1 and the MOSFET Q2 is compensated by taking out it as the potential difference between the node a and the node b.

Additionally, adjacent to the direct sense circuit with a threshold-voltage-offset compensation function, a precharge circuit for pre-charging and equalizing the bit-line pair BL and /BL is connected to the bit-line pair BL and /BL. This precharge circuit consists of MOSFET Q57 and MOSFETs Q58 and Q59, etc. connected between the bit line BL and the bit line /BL, and each gate of them is connected to the bit-line equalize-control line /BLEQ to drive the MOSFETs. Further, each connection node of the MOSFETs Q58 and Q59 is connected to a potential HVDL.

The compensation operation of the direct sense circuit sets, as shown in FIG. 12A, the bit-line equalize-control line /BLEQ at a high level, whereby the MOSFETs Q1 and Q2 of the direct sense circuit are to be the diode connection. Furthermore, by drawing the nodes a and b with a small power source (MOSFETs Q53 to Q56), a source follower operation is obtained. As a result, the potential difference of ΔVth is generated between the two electrodes of the compensation capacitor C51. As shown in FIG. 12B, in this direct sense circuit, the threshold-value characteristic difference is compensated during the time when the bit-line equalize-control line is at high level, and as the compensation operation is completed and the control signal RE reaches a high level, the direct sense operation is started.

2-6. Layout of Pair of MOSFET Used as Differential Amplifier Inputs

Figure 13B:
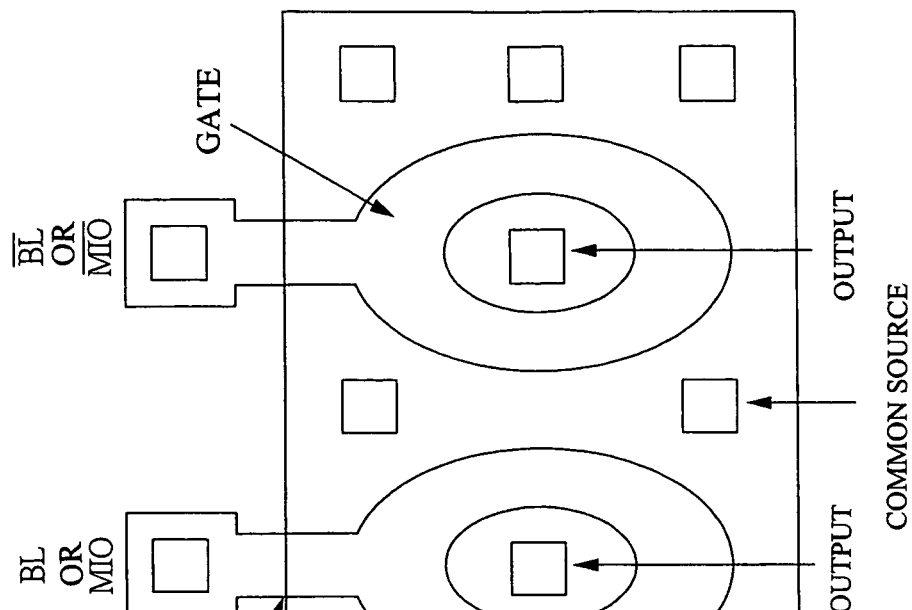
FIG. 13B is a plan view showing another layout of a pair of MOSFETs with a differential amplifier input in a semiconductor memory device according to an embodiment of the present invention.
Figure 13A:
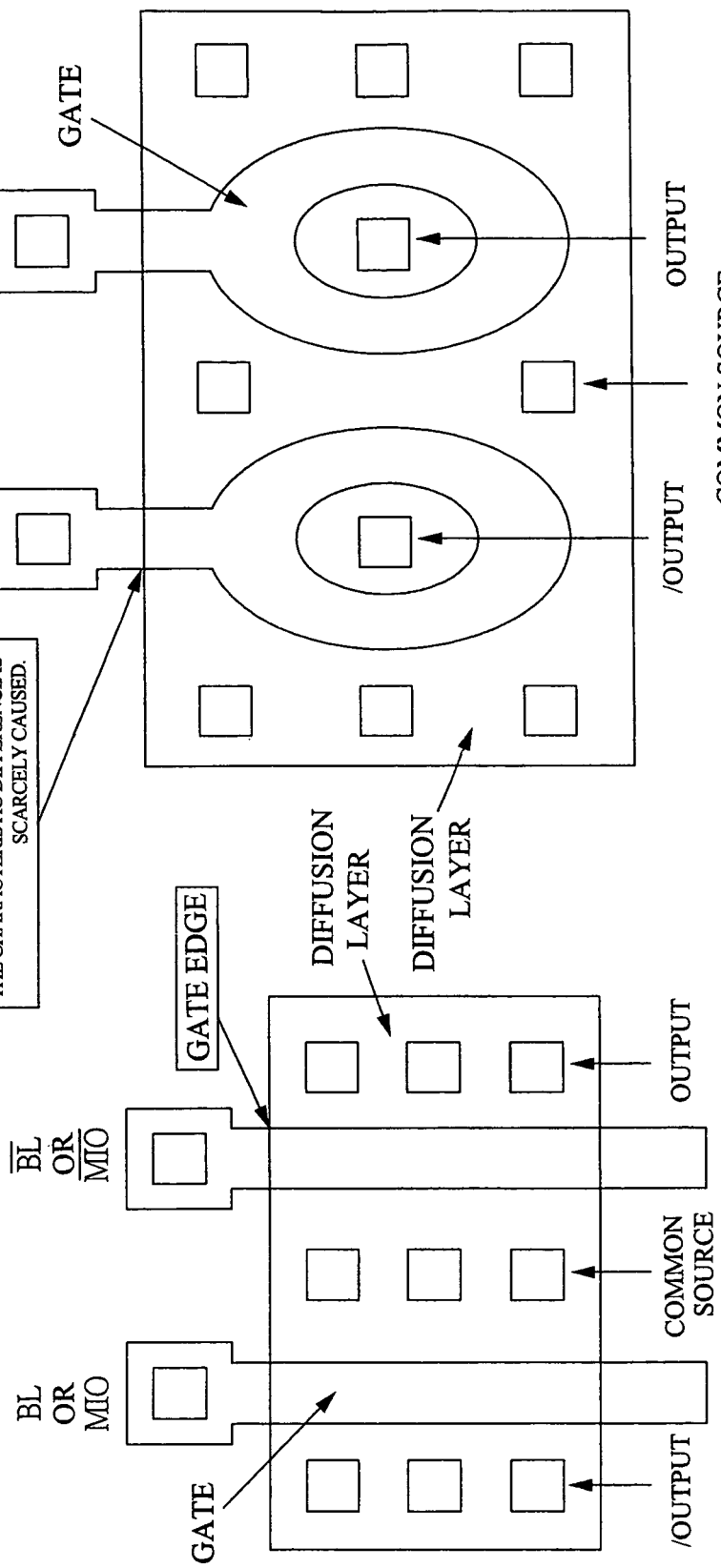
FIG. 13A is a plan view showing a layout of a pair of MOSFETs with a differential amplifier input in a semiconductor memory device according to an embodiment of the present invention.

FIGS. 13A and 13B each are a plan view showing a layout of a pair of MOSFET used as the differential amplifier inputs, and shows a straight gate type and a ring gate type, respectively.

There are the above-mentioned direct sense circuit and a main amplifier, etc. in circuits utilizing the pair of MOSFETs as the inputs of the differential amplifiers. Each of these circuits is particularly composed of the differential amplifiers, and has a structure in which each gate of the pair transistor is formed in a ring shape in order to reduce the characteristic difference in the pair transistor receiving the differential input.

As shown in FIG. 13A, in the case of the straight gate type, each gate of one pair of MOSFETs used as the differential amplifier inputs is linearly formed and connected to the bit-line pair BL and /BL (or main I/O lines MIO and /MIO). Also, the source connected via a contact to the center of a diffusion layer is a common source, and the drains are provided on both sides thereof. The output is taken out from each drain on both sides thereof. Since a large number of gate edges in portions where the diffusion layer and the gates are overlapped exist in this straight type, the characteristic difference is caused between the MOSFETs.

In contrast, in the case of the ring gate type, as shown in FIG. 13B, each gate of one pair of MOSFETs is formed in a ring shape, and since the gate edges in portions where the diffusion layer and the gates are overlapped do not exist, the characteristic difference is scarcely caused between the MOSFETs. Additionally, in the case of the ring gate, the input is taken out from each center of the rings.

According to the direct sense+twin cell method as described above, the following advantages can be achieved.

(1) Reduction of the bit-line capacitance can be achieved. That is, the complementary one-intersection two cells/bit method and the direct sense can be combined in a memory cell array in which the number of the cells per bit line is reduced.

(2) Since the bit-line readout signals are sufficiently obtained, the input signals of the main amplifier can be obtained before the amplification of the bit line and be amplified.

(3) It is possible to compensate the characteristic unbalance between one pair of MOSFETs used as the differential amplifier in the direct sense circuit and also to accurately transmit, to the data line, the signal read out at the bit line.

(4) It is possible to compensate the characteristic unbalance between one pair of MOSFETs used as input sections of the main amplifier so as to rapidly amplify the small differential signal of the data line.

Consequently, according to the direct sense+twin cell method as described above, the high-speed of the access time can be realized.

Also, in the complementary two cells/bit method according to the present invention, the following advantages can be obtained as an advanced technique capable of achieving the ultra-high speed operation of the DRAM core.

(1) The "L" data of the memory cell has readout speed and writing speed (rewriting speed) higher than the "H" data. This can reduce the signal loss at the time of the high-speed sense and the short cycle.

(2) The data is maintained with both the voltages of "H"/"L" regardless of "0"/"1" of the data. This can provide high resistance to the junction leakage, large margin for the high-speed (=high temperature) operation is obtained.

(3) The signals of "H"/"L" are simultaneously read out regardless of "0"/"1" of the data. This can perform the stable and high-speed sense due to the small data pattern dependency.

(4) Since the "H" signal dependency of the memory cell is small, the VPP potential is reduced to some extent. This can reduce the VPP operation noise caused by the VPP load-current reduction during the high-speed operation.

Figure 14C:
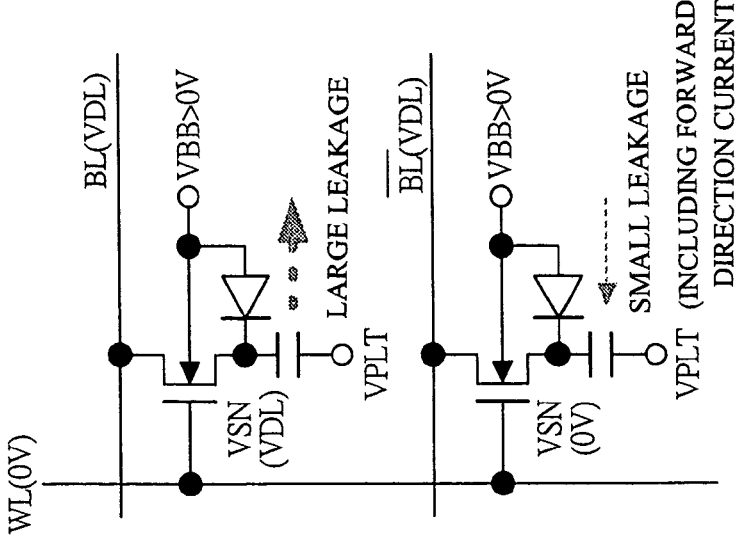
FIG. 14C is a circuit diagram showing a potential relationship upon holding a memory cell data charge in a semiconductor memory device according to an embodiment of the present invention.
Figure 14B:
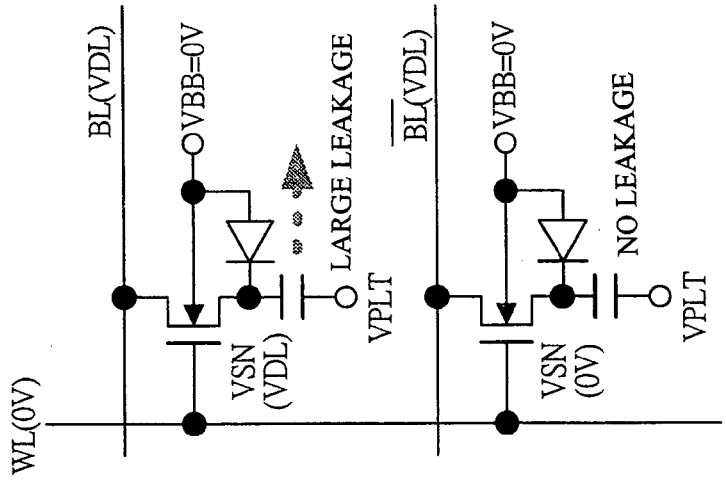
FIG. 14B is a circuit diagram showing a potential relationship upon holding memory cell data charges in a semiconductor memory device according to an embodiment of the present invention.
Figure 14A:
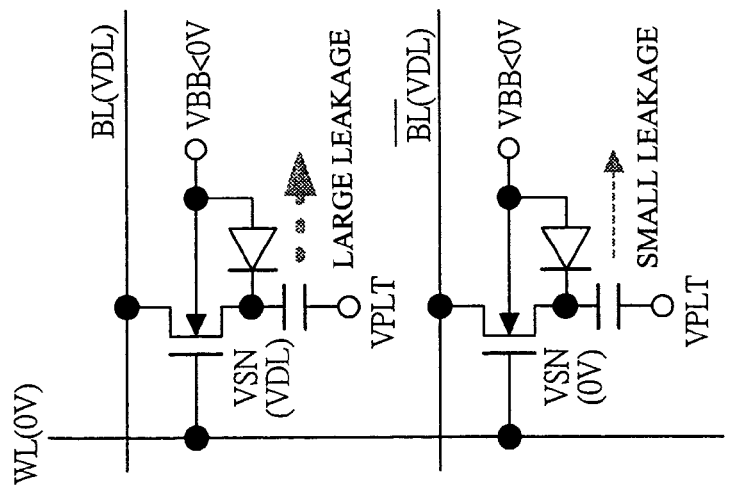
FIG. 14A is a circuit diagram showing a potential relationship upon holding memory-cell information charges in a semiconductor memory device according to an embodiment of the present invention.

3. Substrate Potential VSS+Twin Cell Method 3-1. Potential Relationship During the Time of Holding Memory-cell Information Charges FIGS. 14A to 14C are each a circuit diagram showing the potential relationship during the time of holding the memory-cell information charges, and illustrate the cases where VBB<0 V, VBB=0 V, and VBB>0 V, respectively. FIGS. 15A to 15C are each a waveform diagram showing the potential relationship during the time of holding the memory-cell information charges, and illustrate the cases where VBB<0 V, VBB=0 V, and VBB>0 V, respectively.

The potential relationship during the time of holding the memory-cell information charges is applied to the DRAM in which: a plurality of dynamic memory cells composed of one transistor and one capacitor are simultaneously selected; the complementary signals are read out to the corresponding bit-line pair; and the potential of the bit-line pair is amplified to the predetermined "H" and "L" levels by the sense amplifier connected to the bit-line pair.

Particularly, the potential VBB of the silicon substrate formed in the back gate of the transistor is: (i) the case of being substantially equal to either of the predetermined "H" or "L" level; (ii) the case of being set to either of a voltage lower than the predetermined "H" level or a voltage higher than the predetermined "L" level; or the like. Further, the potential VBB is: (iii) the case of being combined with the above case (i) and where the precharge potential of the bit-line pair is substantially equal to the predetermined "L" or "H" level opposite to the potential of the silicon substrate; (iv) the case of being combined with the case (ii) and where the precharge potential of the bit-line pair is substantially equal to the predetermined "L" or "H" level on the side having larger one of the potential differences between the potential of the silicon substrate and its precharge potential; or the like.

This potential relationship during the time of holding the memory-cell information charges indicates the case where a memory cell whose a leakage current is helplessly increased due to the interface state caused by contamination and crystal loss, and a normal memory cell whose a leakage current is not increased are combined through the complementary two cells/bit method. In general, the ratio of the memory cell whose a leakage current is helplessly increased is about one millionth in all of the memory cells in the LSI and the distribution of such memory cells is random. Therefore, such combination is realized with strong possibility.

As shown in FIG. 14A, the gate of the memory cell with large leakage current is connected to the word line WL and the drain thereof is connected to one bit line BL of the bit-line pair. Also, the gate of the memory cell with small leakage current is connected to the same word line WL and the drain thereof is connected to the other bit line BL of the bit-line pair. Under the above structure, in the case where 0 V is applied to the word line WL and a VDL potential is applied to the bit-line pair BL and /BL and the potential of the silicon substrate VBB is set at VBB<0 V, the information holding time capable of securing an readout-enabling minimum-signal amount is short.

More specifically, as shown in FIG. 15A, as the time goes, the voltage VSN of the storage node in the memory cell with a large leakage current is rapidly decreased from VDL to VBB and the voltage VSN of the storage node in the memory cell with small leakage current is gradually decreased from VSS to VBB. The relationship in voltage between the memory cells is reversed after the predetermined period of time. As a result, the information holding time capable of securing the readout-enabling minimum-signal amount becomes short. This potential relationship is a technique to be a premise of the present invention.

In contrast, as shown in FIG. 14B, in the case where 0 V is applied to the word line WL and the VDL potential is applied to the bit-line pair BL and /BL and the silicon substrate potential VBB is set at VBB=0 V, the information holding time capable of securing the readout-enabling minimum-signal amount can be longer in comparison to that of the above-described case of VBB<0 V. More specifically, as shown in FIG. 15B, the voltage VSN of the storage node in the memory cell with a large leakage current is reduced from VDL to VBB=VSS, and the voltage VSN of the storage node in the memory cell with a small leakage current is almost unchanged at VBB=VSS. Therefore, it is possible to extend the information holding time capable of securing the readout-enabling minimum-signal amount.

Furthermore, as shown in FIG. 14C, in the case where 0 V is applied to the word line WL and the VDL potential is applied to the bit-line pair BL and /BL and the silicon substrate potential VBB is set at VBB>0 V, the information holding time capable of securing the readout-enabling minimum-signal amount can be longer in comparison to that of the above-described case of VBB=0 V. More specifically, as shown in FIG. 15C, the voltage VSN of the storage node in the memory cell with a large leakage current is gradually reduced from VDL to VBB, and the voltage VSN of the storage node in the memory cell with a small leakage current (including forward current) is gradually increased from VSS to VBB. Therefore, it is possible to further extend the information holding time capable of securing the readout-enabling minimum-signal amount.

Figure 16:
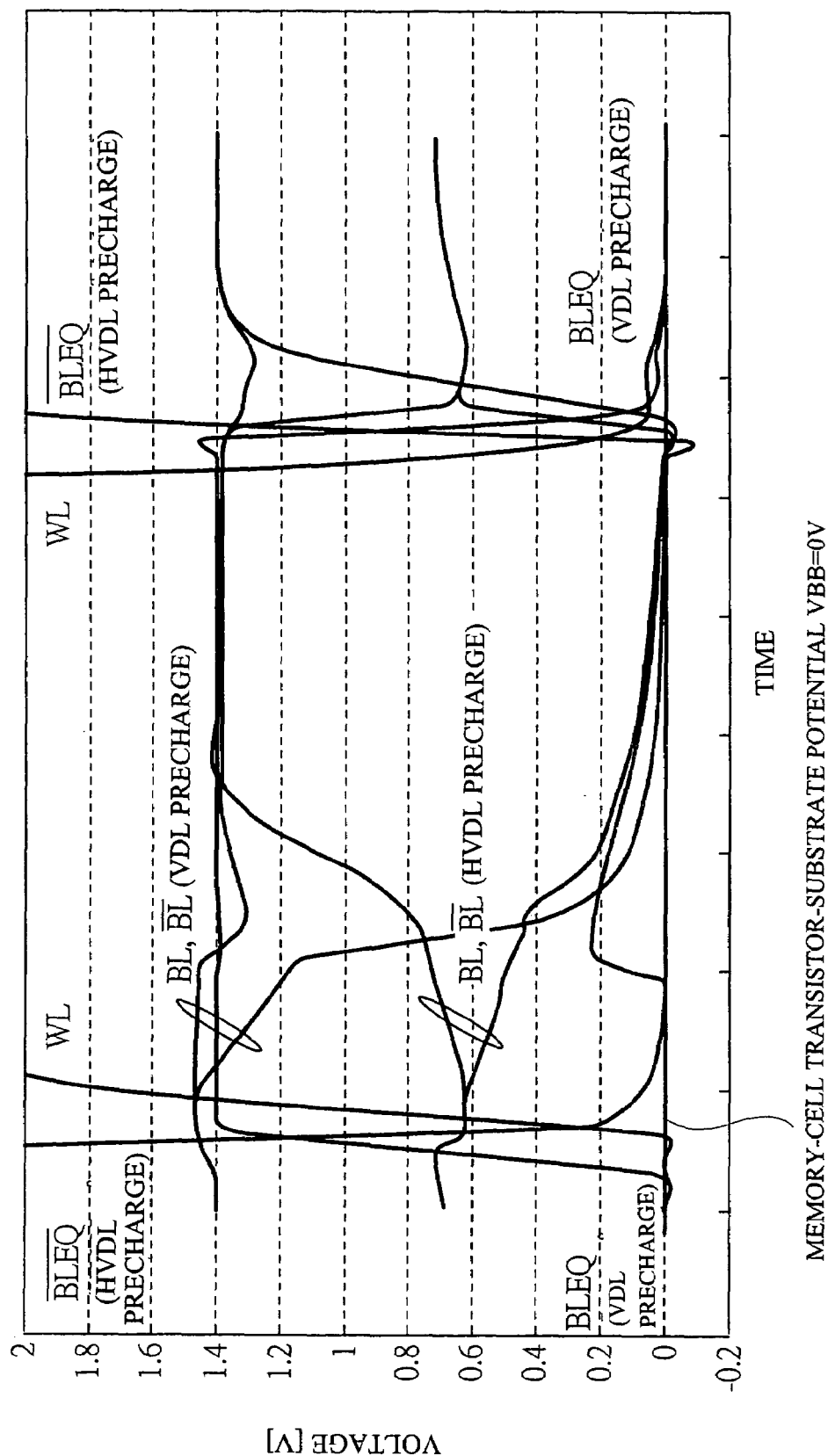
FIG. 16 is a waveform diagram showing an operation waveform and a potential relationship (substrate potential=0 V) upon reading memory cell information in a semiconductor memory device according to an embodiment of the present invention.
Figure 17:
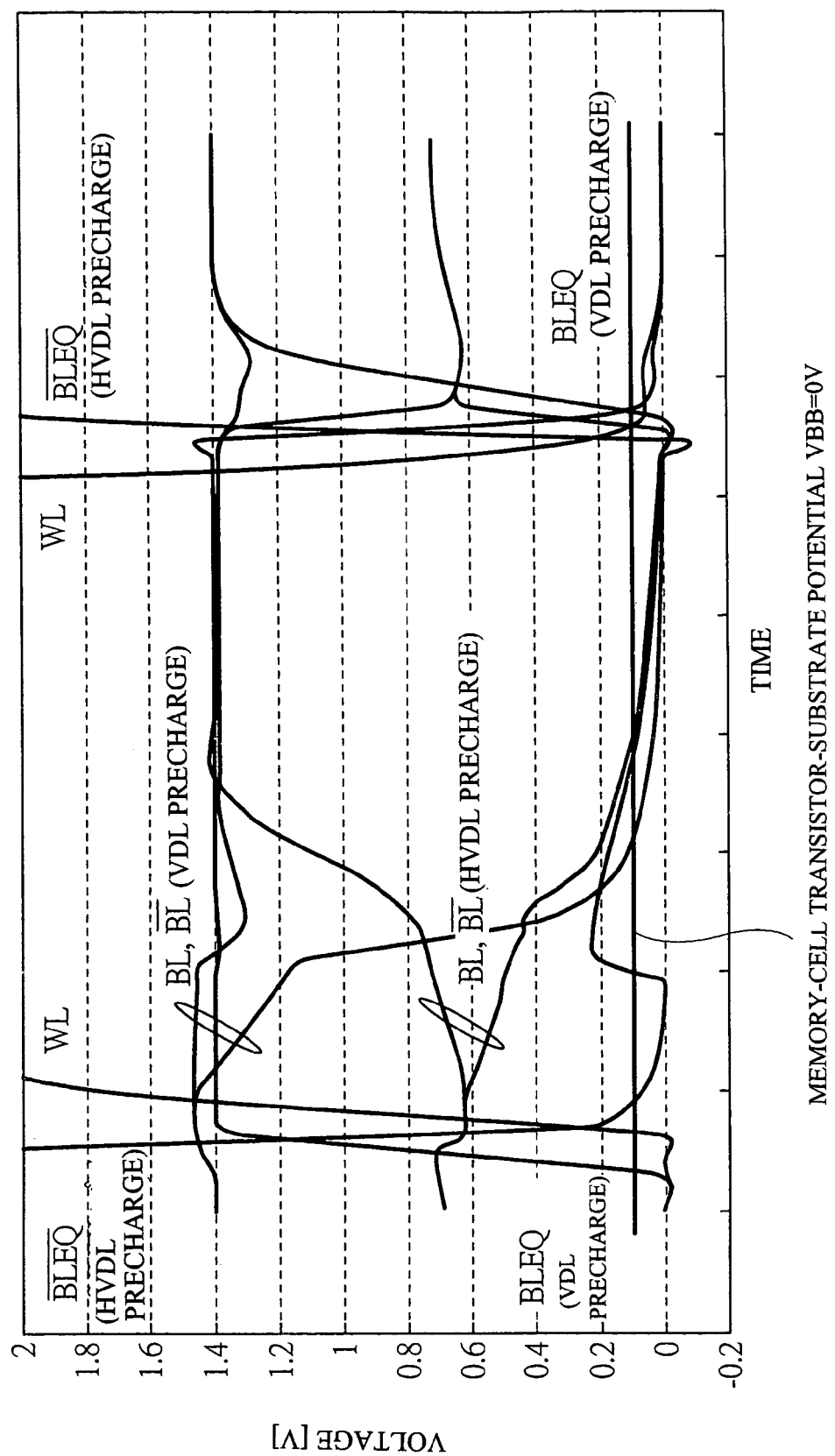
FIG. 17 is a waveform diagram showing an operation waveform and a potential relationship (substrate potential=0.1 V) upon reading memory cell information in a semiconductor memory device according to an embodiment of the present invention.

3-2. Operation Waveform and Potential Relationship at the Time of Readout of Memory Cell Information FIGS. 16 and 17 are each a waveform diagram showing the operation waveform and the potential relationship at the time of the readout of the memory cell data. FIG. 16 shows the case of setting the substrate potential at VBB=0 V, and FIG. 17 shows the case of setting the substrate potential at VBB=0.1 V.

With regard to the operation waveform and the potential relationship at the time of the readout of the memory cell information, (i) if the substrate potential VBB is set at VBB=0 V in the case where the potential of the silicon substrate, in which the back gate of the transistor is formed, is substantially equal to either of the predetermined "H" or "L" level, then the operation waveform of the bit-line pair BL and /BL is shown in FIG. 16 (HVDL precharge). The waveform of the bit-line equalize-control line corresponding to this case is shown by /BLEQ (HVDL precharge).

Furthermore, (iii) in the case of being combined with the case (i) and where the precharge potential of the bit-line pair is substantially equal to the predetermined "L" or "H" level opposite to the potential of the silicon substrate, the operation waveform of the bit-line pair BL and /BL is shown in FIG. 16 (VDL precharge). The waveform of the bit-line equalize-control line corresponding to this case is shown by BLEQ (VDL precharge).

Also, (ii) if the substrate potential is set at VBB=0.1 V in the case where the potential of the silicon substrate, in which the back gate of the transistor is formed, is set to a voltage lower than the predetermined "H" level or higher than the predetermined "L" level, then the operation waveform of the bit-line pair BL and /BL is shown in FIG. 17 (HVDL precharge). The waveform of the bit-line equalize-control line corresponding to this case is shown by /BLEQ (HVDL precharge).

Furthermore, (iv) in the case of being combined with the case (ii) and where the precharge potential of the bit-line pair is substantially equal to the predetermined "L" or "H" level on the side having the larger one of the potential differences between the potential of the silicon substrate and its precharge potential, the operation waveform of the bit-line pair BL and /BL is shown in FIG. 17 (VDL precharge). The waveform of the bit-line equalize-control line corresponding to this case is shown by BLEQ (VDL precharge).

3-3. Relationship of Readout-signal Amount to Storage-node Potential at the Time of Readout FIGS. 18A and 18B each show the relationship of the readout-signal amount to the storage-node potential at the time of readout, and are a characteristic diagram and a circuit diagram, respectively. FIG. 19 is a waveform diagram showing the relationship of the readout-signal amount to the storage-node potential at the time of the readout.

The relationship of the readout-signal amount to the storage-node potential at the time of readout can be described with reference to the configuration composed of a memory cell array, a sense amplifier, and a precharge circuit, etc. shown in FIG. 18B.

The memory cell array is arranged in matrix at the positions corresponding to the intersections between the plurality of bit-line pairs BL and /BL and the plurality of word lines WL, and is constituted to include a plurality of memory cells MC each composed of one transistor and one capacitor.

The sense amplifier is a circuit for detecting/amplifying the data read out to the bit-line pair BL and /BL, and connected to the bit-line pair BL and /BL, and has a latch-type (gate-drain intersecting type) circuit system with a CMOS configuration, which is composed of two p-channel MOSFETs Q61 and Q62 and two n-channel MOSFETs Q63 and Q64. The p-channel MOSFETs Q61 and Q62 are connected to the potential VDL, and the n-channel MOSFETs Q63 and Q64 are connected to the ground potential VSS via the MOSFET Q65, whose a gate is connected to the sense amplifier control line SAN to be driven.

The precharge circuit is a circuit for pre-charging the bit-line pair BL and /BL, and connected to the bit-line pair BL and /BL, and composed of three p-channel MOSFETs Q66 to Q68, each gate of which is connected to the bit-line equalize-control line BLEQ to be driven. Also, the connection nodes of the MOSFET Q67 and MOSFET Q68 are connected to the potential VDL.

Figure 18B:
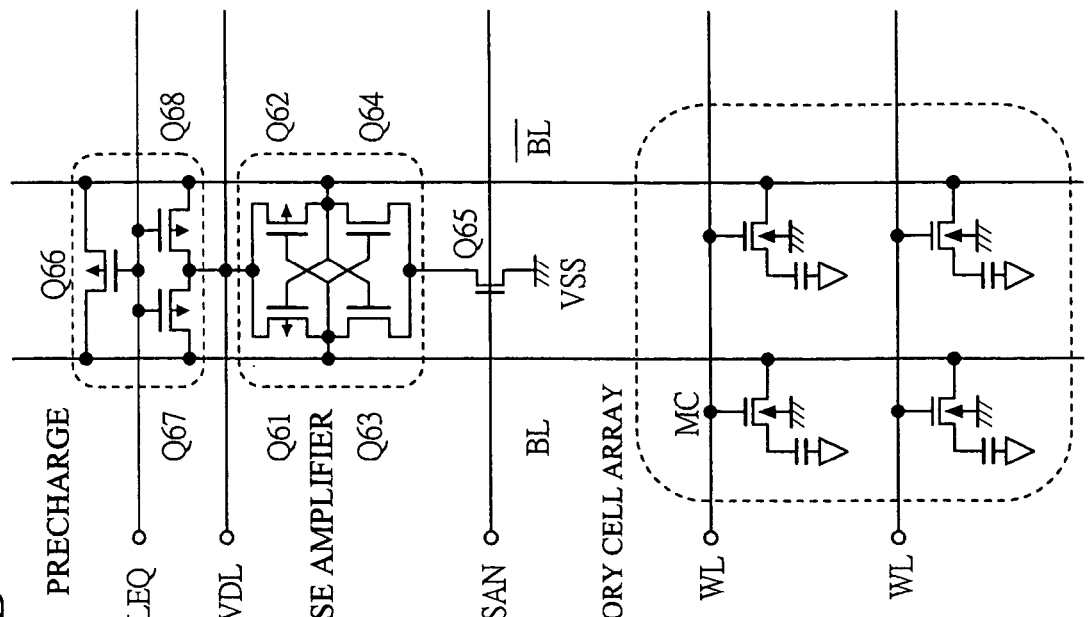
FIG. 18B is a circuit diagram showing a relationship of a readout signal amount to a storage node potential upon being read in a semiconductor memory device according to an embodiment of the present invention.
Figure 18A:
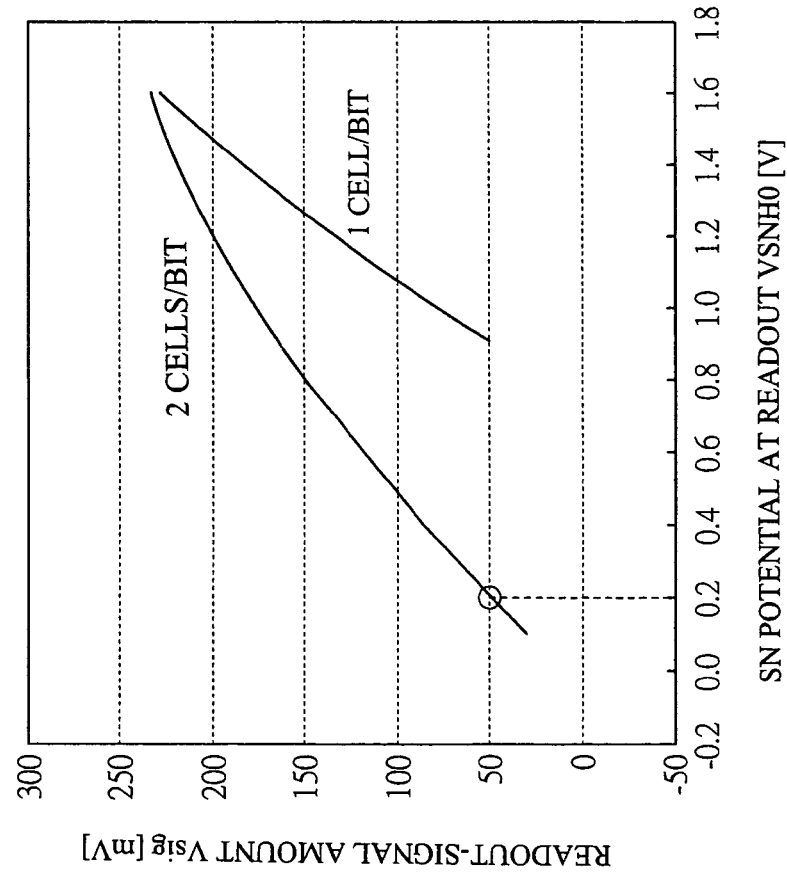
FIG. 18A is a characteristic diagram showing a relationship of a readout signal amount to a storage node potential upon being read in a semiconductor memory device according to an embodiment of the present invention.
Figure 19:
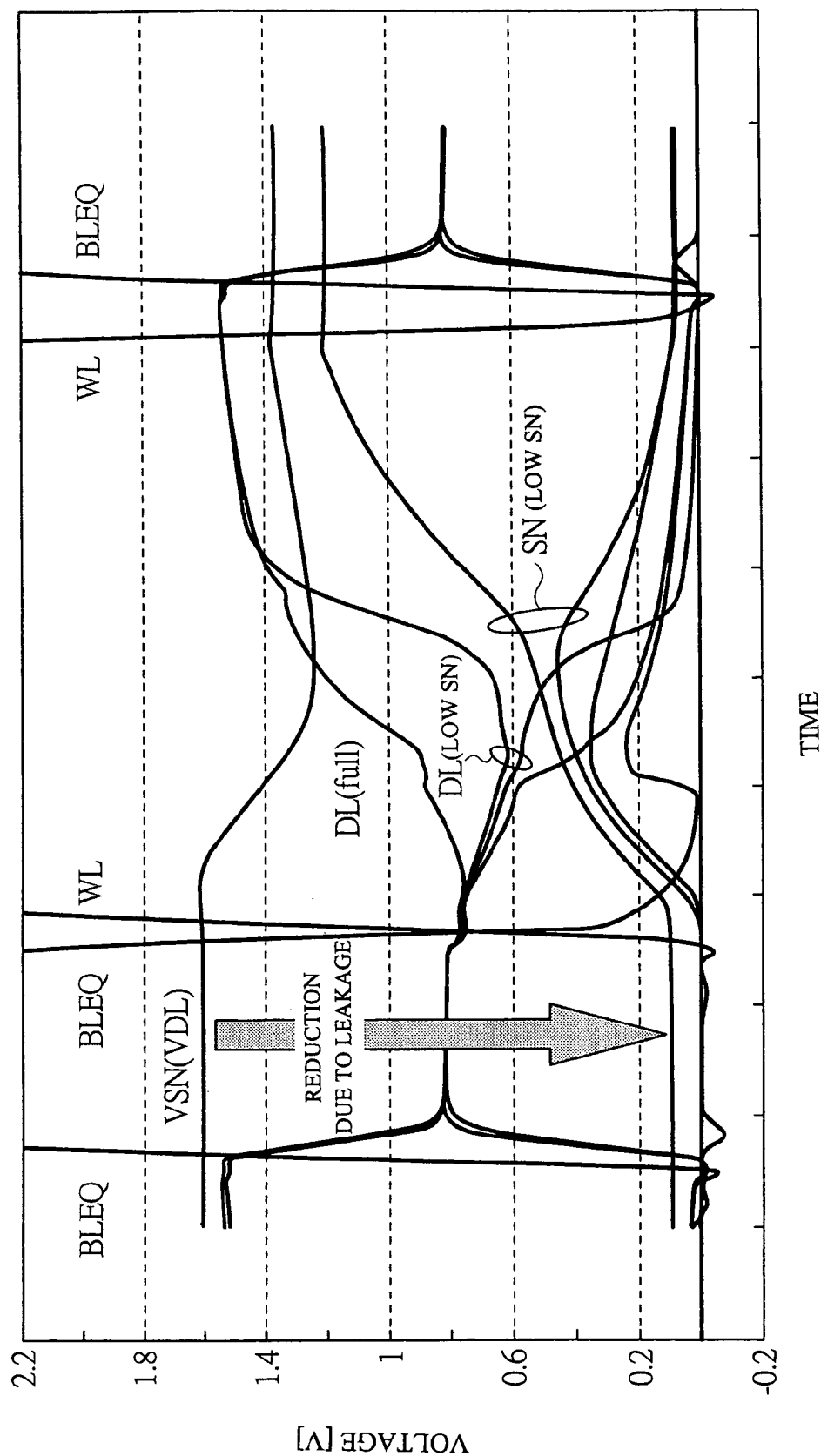
FIG. 19 is a waveform diagram showing a relationship of a readout signal amount to a storage node potential upon being read in a semiconductor memory device according to an embodiment of the present invention.

In the case of two cells/bit method as shown in FIG. 18B, in the relationship of the readout signal amount Vsig to the storage-node potential VSNH0 at the time of the readout shown in FIG. 18A, the characteristics at the time when the storage-node potential of the two cells/bit to pair with the memory cells MC is 0 V are as follows. That is, there are obtained the characteristics such that: the readout-signal amount is about 230 mV when the storage-node potential at the readout is about 1.6 V; it is about 180 mV when about 1.0 V; and it is about 100 mV when about 0.4 V. Therefore, even if the storage-node potential is as small as about 0.2 V, the readout-signal amount of about 50 mV can be ensured. In contrast, in the case of the one cell/bit method, if the storage-node potential is about 0.9 V, the readout-signal amount will be reduced to about 50 mV.

Even if the storage-node potential VSN (VDL) is decreased from about 1.6 V to about 0.1 V due to the leakage as shown in FIG. 19, the readout and refresh can be properly performed in the complementary two cells/bit method. Note that FIG. 19 shows the waveforms of the readout operation of the data-line pair DL and /DL in each of the cases where the storage-node potential VSN is full (no leakage) and is reduced due to the leakage.

3-4. Back-gate Potential of Transistor

Figure 20:
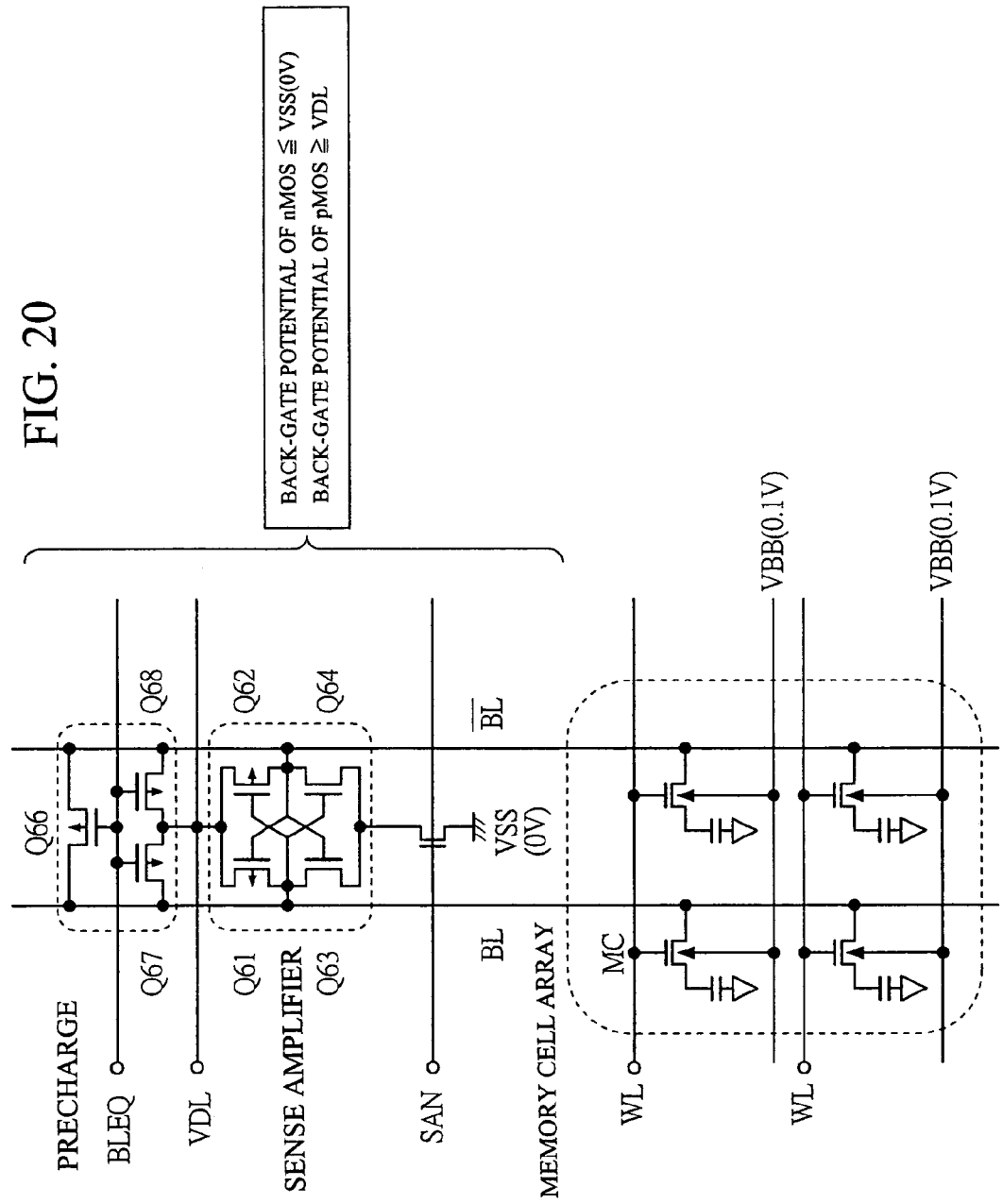
FIG. 20 is a circuit diagram showing a back gate potential of a transistor in a semiconductor memory device according to an embodiment of the present invention.
Figure 21:
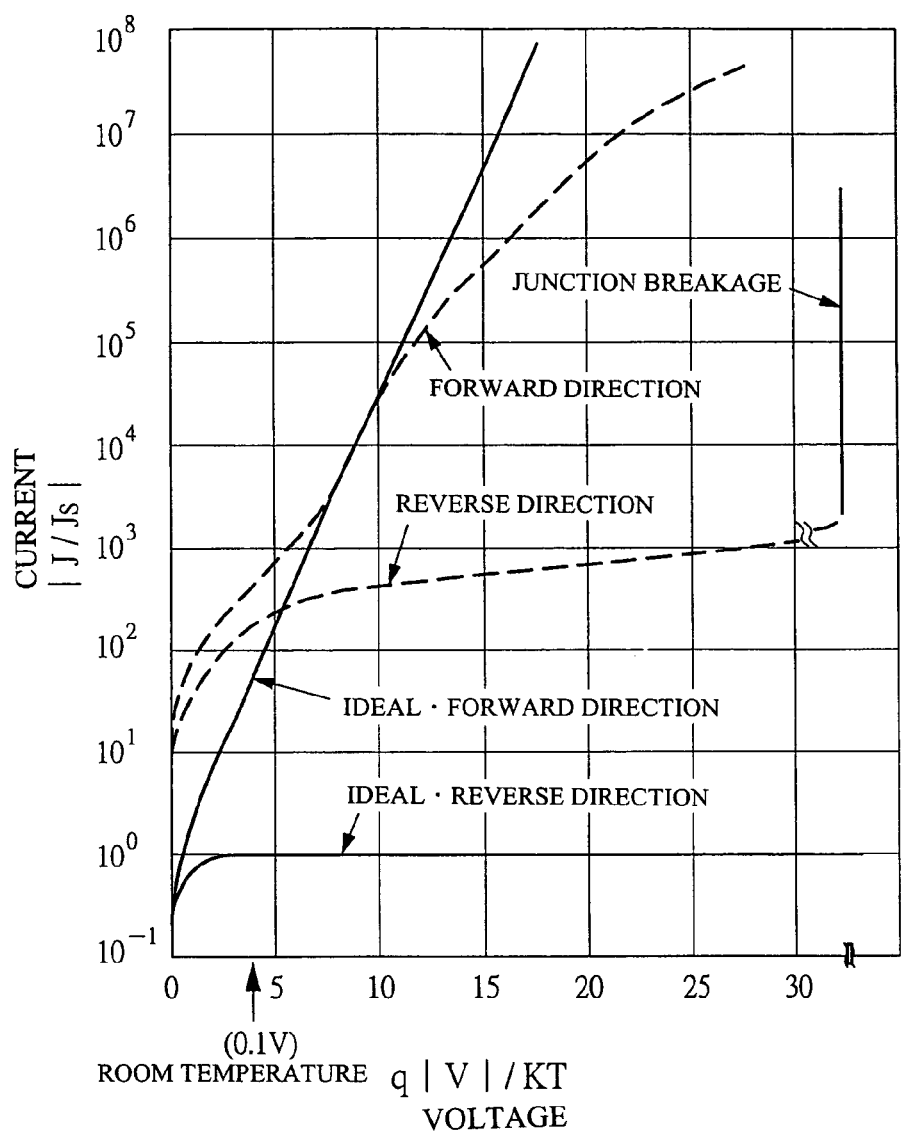
FIG. 21 is a characteristic diagram showing a current-voltage characteristic of a diode in a semiconductor memory device according to an embodiment of the present invention.
Figure 22:
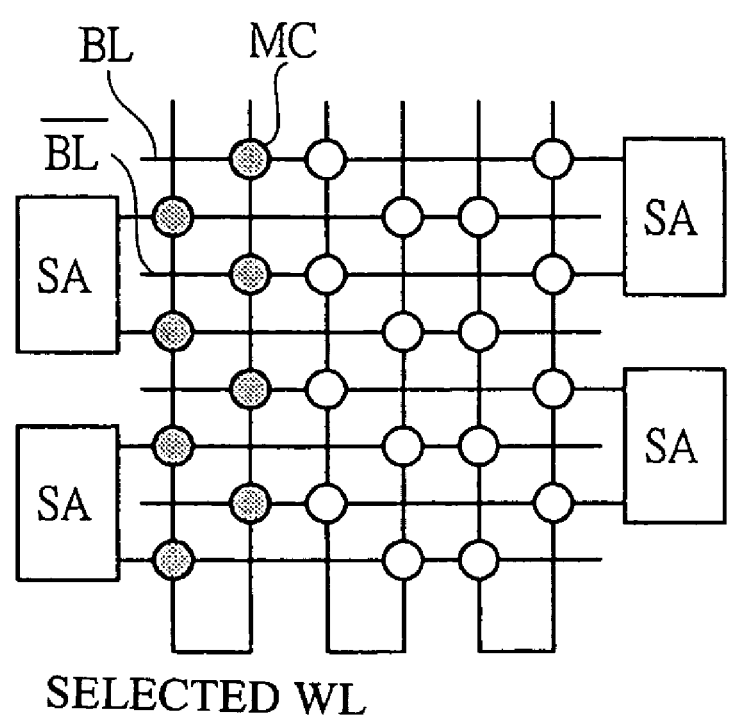
FIG. 22 is a connection diagram showing a connection configuration between bit-line pairs orthogonal to word lines and sense amplifiers in a semiconductor memory device examined as the premise of the present invention.
Figure 23A:
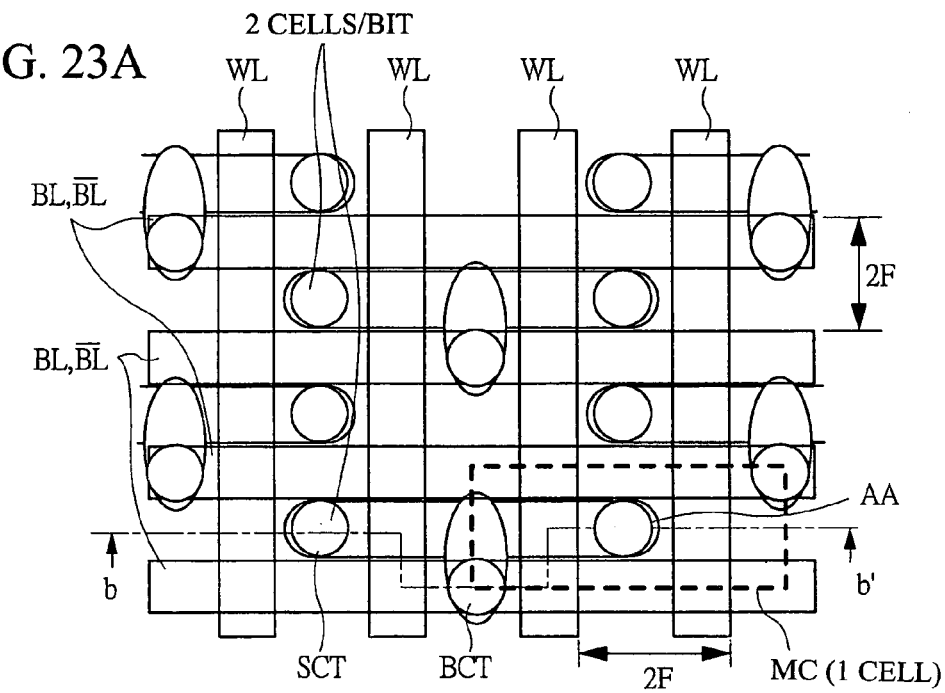
FIG. 23A is a schematic plan view showing a twin cell structure of a memory cell in a semiconductor memory device examined as the premise of the present invention.
Figure 23B:
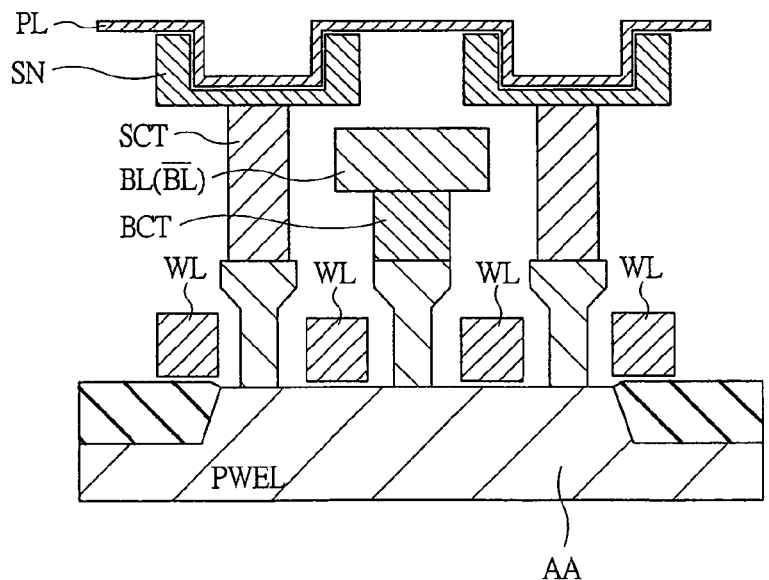
FIG. 23B is a schematic cross-sectional view showing a twin cell structure of a memory cell in a semiconductor memory device examined as the premise of the present invention.

FIG. 20 is a circuit diagram showing the back-gate potential of a transistor. FIG. 21 is a characteristic diagram showing the current-voltage characteristic of a diode.

The back-gate potential of the transistor, except that used to form the memory cell, is set to the predetermined "L" level or lower, or the predetermined "H" level or higher.

In the sense amplifier and the precharge circuit as shown in FIG. 20, the p-channel MOSFETs Q61 and Q62 constituting the sense amplifier and the p-channel MOSFETs Q66 to Q68 constituting the precharge circuit are each set at the back-gate potential≧VDL (to have a back-gate potential of VDL or more). Further, the n-channel MOSFETs Q63 and Q64 constituting the sense amplifier are each set at the back-gate potential≦VSS (0 V) (to have a back-gate potential of VSS (0 V) or less).

Note that, in this case, the potential VBB of the silicon substrate, on which the back gate of the memory cell MC is formed, is 0.1 V. Thus, as shown in the current-voltage characteristic of the diode in FIG. 21, even if 0.1 V is applied as the substrate potential VBB, the junction current, in the case where the voltage applied to the PN junction of the diode at room temperature is only about 0.1 V, is sufficiently small even in a forward direction similarly to a reverse direction. Therefore, the leakage current is sufficiently small within this range even in the transistor of the MOSFET employing the PN junction in the forward direction, whereby there arises no problem in the operation.

According to the substrate potential VSS+twin cell method as described above, the following advantages can be obtained.

(1) The substrate potential VBB=VSS (0V) method is combined therewith. This can improve the operation margin relative to the charge leakage of "H" of the memory cell MC. Further, if VBB>VSS is satisfied, the data can be properly read out even in the case of a full discharge.

(2) By combining the bit-line VDL precharge method therewith, it is possible to apply the sufficient driving voltage to the gate of the MOSFET in the sense amplifier. Therefore, the bit-line voltage (VDL) can be made a low voltage. Also, the overdrive of the sense amplifier and the voltage-increasing power source (VPP) for bit-line equalize become unnecessary even in the case of the low voltage. This allows for reducing the total power even in the VDL precharge.

(3) As merits usually obtained by the complementary two cells/bit method, the dummy cell for the reference voltage becomes unnecessary even in the bit-line VDL precharge method. This facilitates the fabrication thereof. Further, since the signal-charge amount of the memory cell MC is increased twice, the readout-signal amount is not decreased even if the VDL is made a lower voltage. As a result, the operation margin can be ensured.

Therefore, according to the substrate potential VSS+twin cell method described above, it is possible to extend the refresh period and reduce the current consumption due to the refresh operation and obtain the DRAM with reduced power consumption.

As described above, according to the semiconductor memory device in the embodiment, the following advantages can be obtained. That is, (i) the increase in the area of the memory cell is reduced even in the twin cell method by adopting the twin cell structure employing one-intersection $6F^2$ cell, (ii) the period of the ultra-high speed readout time is realized by adopting the direct sense+twin cell method, and (iii) since the refresh period at the time of the self refresh is lengthened by adopting the substrate potential VSS+twin cell method, the highly integrated and ultra-high speed DRAM, in which the power consumption during the information holding time is largely reduced, can be obtained.

In the foregoing, the inventions made by the inventors have been concretely described based on the embodiment. However, needless to say, the present invention is not limited to the foregoing embodiment and can be variously modified and changed without departing from the gist thereof.

For example, the case of applying the present invention to the DRAM employing the one-intersection cell·two cells/bit method has been described in the foregoing embodiment. However, the application of the present invention is not limited to this, and the application to a semiconductor device such as a logic embedded DRAM etc. is also effective, and further the present invention can be applied to an FRAM etc. employing the two cells/one bit method.

Further, even in the one cell/bit method, by reducing the parasitic capacitance Cb of the bit line to about 2.5 times as large as or less than the memory cell capacitor capacitance Cs to ensure the readout-signal amount almost equivalent to that of the two cells/bit method, the direct sense method disclosed herein can be used.

The advantages achieved by the typical ones of the inventions disclosed in this application will be briefly described as follows.

(1) By adopting the twin cell structure employing the one-intersection $6F^2$ cell, the increase in the area of the memory cell can be reduced even in the case of the twin cell method.

(2) The period of the ultra-high speed readout time can be realized by employing the direct sense+twin cell method.

(3) The refresh period at the time of the self refresh can be lengthened by employing the substrate potential VSS+twin cell method.

(4) According to items (1) to (3) described above, it is possible to obtain a highly integrated and ultra-high speed semiconductor memory device such as a DRAM, etc. in which the power consumption during the information holding time is largely reduced.

What is claimed is:

1. A semiconductor memory device comprising:
a plurality of folded-type bit-line pairs arranged in parallel to each other;
a plurality of word lines orthogonal to said plurality of bit-line pairs; and
dynamic memory cells each composed of one transistor and one capacitor and arranged in matrix at positions corresponding to the intersections between said plurality of bit-line pairs and said plurality of word lines,
wherein one electrode of said capacitor is connected to a common electrode together with each one electrode of other plurality of capacitors arranged in matrix, and the other electrode of said capacitor is connected to one side of a source-drain path of said transistor, the other side of the source-drain path of said transistor is connected to said bit-line pair, and a gate electrode of said transistor is connected to said word lines,
wherein a circuit for performing writing of memory information to said memory cell, or readout of memory information from said memory cell, or refresh of memory information of said memory cell in response to said plurality of bit-line pairs is connected, and wherein when a half pitch of said word line is defined as F, the pitch of each bit line of said bit-line pairs is larger than 2F and smaller than 4F.

2. The semiconductor memory device according to claim 1, wherein each of said bit-line pairs is two bit lines adjacent to each other.

3. The semiconductor memory device according to claim 1, wherein each of said bit-line pairs is two bit lines not adjacent to each other.

4. The semiconductor memory device according to claim 1, wherein said capacitor is formed above said bit-line pairs via an insulating film.

5. The semiconductor memory device according to claim 1 or 4, wherein an active region in a substrate, on which a source, channel and drain of said transistor are formed, is obliquely formed relative to a direction of said bit line pairs.

6. The semiconductor memory device according to claim 1, wherein a wiring layer for forming each of said word lines is formed of a laminated film of polysilicon and metal or a metal film.

7. The semiconductor memory device according to claim 1, wherein a wiring layer for forming each of said bit-line pairs is formed of a metal film.

8. The semiconductor memory device according to claim 1, wherein each of said word lines includes: a main word line with a first length; and a secondary word line with a second length, which is shorter than said main word line and is driven by a driving circuit receiving a signal of said main word line and constitutes the gate electrode of said transistor.

9. The semiconductor memory device according to claim 1, wherein said word line includes a first wiring layer for forming the gate electrode of said transistor and a second wiring layer which is different from said first wiring layer and is connected to said first wiring layer at a plurality of positions.

10. A semiconductor memory device comprising:
a plurality of folded-type bit-line pairs arranged in parallel to each other;
a plurality of word lines crossing at an acute angle to said plurality of bit-line pairs; and
dynamic memory cells each composed of one transistor and one capacitor and arranged in matrix at positions corresponding to intersections between said plurality of bit-line pairs and said plurality of word lines,
wherein one electrode of said capacitor is connected to a common electrode together with each one electrode of other plurality of capacitors arranged in matrix, and the other electrode of said capacitor is connected to one side of a source-drain path of said transistor, the other side of the source-drain path of said transistor is connected to said bit-line pairs, and a gate electrode of said transistor is connected to said word lines, wherein a circuit for performing writing of memory information to said memory cell, or readout of memory information from said memory cell, or refresh of memory information of said memory cell in response to said plurality of bit-line pairs is connected, and wherein, when a half pitch of each of said word lines is defined as F, the pitch of each bit line of said bit-line pairs is larger than 2F and smaller than 4F.

11. The semiconductor memory device according to claim 10, wherein each said bit-line pairs is two bit lines adjacent to each other.

12. The semiconductor memory device according to claim 10, wherein each of said bit-line pair is two bit lines not adjacent to each other.

13. The semiconductor memory device according to claim 10, wherein said capacitor is formed above said bit-line pairs via an insulating film.

14. The semiconductor memory device according to claim 10 or 13, wherein an active region in a substrate, on which a source, channel and drain of said transistor are formed, is obliquely formed relative to a direction of said bit-line pairs.

15. The semiconductor memory device according to claim 10, wherein a wiring layer for forming each of said word lines is formed of a laminated film of polysilicon and metal, or a metal film.

16. The semiconductor memory device according to claim 10, wherein a wiring layer for forming each of said bit-line pairs is formed of a metal film.

17. The semiconductor memory device according to claim 10, wherein each of said word lines includes: a main word line with a first length; and a secondary word line with a second length, which is shorter than said main word line and is driven by a driving circuit receiving a signal of said main word line and constitutes the gate electrode of said transistor.

18. The semiconductor memory device according to claim 10, wherein each of said word lines includes: a first wiring layer for forming the gate electrode of said transistor; and a second wiring layer which is different from said first wiring layer and is connected to said first wiring layer at a plurality of positions.

* * * * *